(12) United States Patent
Liu et al.

(10) Patent No.: US 11,568,673 B2
(45) Date of Patent: Jan. 31, 2023

(54) ARRAY SUBSTRATE AND METHOD FOR MANUFACTURING THE SAME, METHOD AND ASSEMBLY FOR DETECTING LIGHT, AND DISPLAY DEVICE

(71) Applicant: BOE TECHNOLOGY GROUP CO., LTD., Beijing (CN)

(72) Inventors: Qingzhao Liu, Beijing (CN); Ke Wang, Beijing (CN); Guoqiang Wang, Beijing (CN); Shuilang Dong, Beijing (CN)

(73) Assignee: BOE Technology Group Co., LTD., Beijing (CN)

( * ) Notice: Subject to any disclaimer, the term of this patent is extended or adjusted under 35 U.S.C. 154(b) by 23 days.

(21) Appl. No.: 17/256,678

(22) PCT Filed: May 26, 2020

(86) PCT No.: PCT/CN2020/092374
§ 371 (c)(1),
(2) Date: Dec. 29, 2020

(87) PCT Pub. No.: WO2020/238912
PCT Pub. Date: Dec. 3, 2020

(65) Prior Publication Data
US 2021/0124897 A1    Apr. 29, 2021

(30) Foreign Application Priority Data
May 28, 2019   (CN) .......................... 201910452554.8

(51) Int. Cl.
*H01L 27/32* (2006.01)
*G06V 40/13* (2022.01)
(Continued)

(52) U.S. Cl.
CPC ........ *G06V 40/1318* (2022.01); *G06V 10/141* (2022.01); *H01L 27/3234* (2013.01);
(Continued)

(58) Field of Classification Search
CPC .............. G06V 40/1318; G06V 10/141; H01L 27/3234; H01L 27/3246; H01L 27/3258;
(Continued)

(56) References Cited

U.S. PATENT DOCUMENTS

2010/0259517 A1   10/2010   Tsaur et al.
2011/0037729 A1    2/2011   Cho et al.
(Continued)

FOREIGN PATENT DOCUMENTS

| CN | 104393024 A | 3/2015 |
|---|---|---|
| CN | 106708326 A | 5/2017 |

(Continued)

OTHER PUBLICATIONS

International search report of PCT application No. PCT/CN2020/092374 dated Aug. 26, 2020.
(Continued)

*Primary Examiner* — Abdul-Samad A Adediran
(74) *Attorney, Agent, or Firm* — Fay Sharpe LLP

(57) ABSTRACT

An array substrate and a method for manufacturing the same, a method and assembly for detecting light, and a display device are provided. The array substrate includes: a base substrate having a pixel region; a light detecting unit, a switch unit, and a light emitting unit that are located in the pixel region, where the light emitting unit and the light detecting unit share the switch unit.

20 Claims, 11 Drawing Sheets

(51) Int. Cl.
*H01L 51/52* (2006.01)
*H01L 51/56* (2006.01)
*G06V 10/141* (2022.01)
*H01L 27/146* (2006.01)

(52) U.S. Cl.
CPC ...... *H01L 27/3246* (2013.01); *H01L 27/3258* (2013.01); *H01L 51/5253* (2013.01); *H01L 51/56* (2013.01); *H01L 27/14678* (2013.01); *H01L 2227/323* (2013.01)

(58) Field of Classification Search
CPC ............ H01L 51/5253; H01L 51/56; H01L 27/14678; H01L 2227/323; G06F 3/0412
See application file for complete search history.

(56) References Cited

U.S. PATENT DOCUMENTS

| | | | |
|---|---|---|---|
| 2019/0025971 A1* | 1/2019 | Li | G06F 3/0412 |
| 2019/0067385 A1 | 2/2019 | Xu et al. | |
| 2020/0044004 A1 | 2/2020 | Wang et al. | |
| 2020/0119108 A1* | 4/2020 | Park | H01L 27/3234 |

FOREIGN PATENT DOCUMENTS

| | | |
|---|---|---|
| CN | 107579101 A | 1/2018 |
| CN | 109065582 A | 12/2018 |
| CN | 109285870 A | 1/2019 |
| CN | 109309117 A | 2/2019 |
| CN | 109801569 A | 5/2019 |
| CN | 109962114 A | 7/2019 |
| CN | 110071164 A | 7/2019 |
| CN | 110164847 A | 8/2019 |
| EP | 2919269 A2 | 9/2015 |

OTHER PUBLICATIONS

First office action of Chinese application No. 201910452554.8 dated Jun. 12, 2020.
Second office action of Chinese application No. 201910452554.8 dated Oct. 10, 2020.
Notification to grant patent right for invention of Chinese application No. 201910452554.8 issued on Feb. 2, 2021.

* cited by examiner

ARRAY SUBSTRATE AND METHOD FOR MANUFACTURING THE SAME, METHOD AND ASSEMBLY FOR DETECTING LIGHT, AND DISPLAY DEVICE

CROSS-REFERENCE TO RELATED APPLICATIONS

The present disclosure is a 371 of PCT Application PCT/CN2020/092374 filed on May 26, 2020, which claims priority to Chinese Patent Application No. 201910452554.8, filed on May 28, 2019 and titled "ARRAY SUBSTRATE, METHOD AND ASSEMBLY FOR DETECTING LIGHT, AND DISPLAY DEVICE", which are incorporated herein by reference in their entireties.

TECHNICAL FIELD

The present disclosure relates to an array substrate and a method for manufacturing the same, a method and assembly for detecting light, and a display device.

BACKGROUND

With the development of display technology, more and more display products are integrated with a light detecting unit to achieve light detection functions. For example, a display product integrated with a light detecting unit can detect the ambient light in the environment where the display product is located. Generally, the light detecting unit may be integrated on the array substrate of the display product.

SUMMARY

The present disclosure provides an array substrate and a method for manufacturing the same, a method and assembly for detecting light, and a display device. The technical solution of the present disclosure is as follows.

In a first aspect, an array substrate is provided. The array substrate includes:
a base substrate having a pixel region; and
a light detecting unit, a switch unit, and a light emitting unit that are located in the pixel region, where the light detecting unit and the light emitting unit share the switch unit.

In some embodiments, the switch unit is located on the side away from a photosensitive layer of the light detecting unit, the switch unit is insulated from the light detecting unit, and the orthographic projection of the light detecting unit on the base substrate is at least partially overlapped with the orthographic projection of the switch unit on the base substrate.

The switch unit is electrically connected to the light emitting unit.

In some embodiments, the orthographic projection of the switch unit on the base substrate covers the orthographic projection of the light detecting unit on the base substrate.

In some embodiments, the light detecting unit includes a first electrode, a photosensitive layer, and a second electrode that are sequentially stacked in a direction close to the switch unit.

The switch unit includes an active layer, a control terminal, a first terminal, and a second terminal, where the control terminal, the first terminal, and the second terminal are located on the side of the active layer away from the light detecting unit, and one of the first terminal and the second terminal is the source, and the other thereof is the drain.

In some embodiments, the second electrode is made of a light-shielding material, and the orthographic projection of the second electrode on the base substrate is at least partially overlapped with the orthographic projection of the active layer on the base substrate.

In some embodiments, the orthographic projection of the second electrode on the base substrate covers the orthographic projection of the active layer on the base substrate.

In some embodiments, the light emitting unit is an electroluminescent unit, and the first terminal of the switch unit is electrically connected to an anode of the light emitting unit.

In some embodiments, the array substrate further includes:
an insulating layer located between the light detecting unit and the switch unit;
a planarization layer located between the switch unit and the light emitting unit; and,
a pixel defining layer located on the side of the planarization layer away from the switch unit, where the light emitting unit is located in a pixel opening defined by the pixel defining layer.

In some embodiments, the light detecting unit, the switch unit, and the light emitting unit are sequentially distributed in a direction away from the base substrate, and the array substrate further includes:
an encapsulation layer located on the side of the light emitting unit away from the base substrate.

In a second aspect, a method for detecting light is provided for use in the array substrate according to the first aspect or any optional manner of the first aspect, and the light detecting unit of the array substrate includes a first electrode, a photosensitive layer, and a second electrode. The method for detecting light includes:
controlling the switch unit to operate in an ON transition region, where the ON transition region is the region between an ON region and an OFF region of the switch unit;
applying a voltage to the first electrode of the light detecting unit, so that the second electrode of the light detecting unit has a potential, where the potential of the second electrode changes under the action of the light irradiated to the first electrode, causing an output current of the switch unit to change;
determining an amount of change of the output current of the switch unit; and
determining an intensity of illumination irradiated to the first electrode based on the amount of change of the output current of the switch unit.

In some embodiments, the light irradiated to the first electrode is the light reflected by a fingerprint, and after determining the amount of change of the output current of the switch unit, the method for detecting light further includes:
performing fingerprint detection based on the amount of change of the output current of a plurality of the switch units.

In a third aspect, an assembly for detecting light is provided for use in the array substrate according to the first aspect or any optional manner of the first aspect, and the light detecting unit of the array substrate includes a first electrode, a photosensitive layer, and a second electrode. The assembly for detecting light includes:
a controlling module, configured to control the switch unit to operate in an ON transition region, where the ON transition region is the region between an ON region and an OFF region of the switch unit;

a voltage applying module, configured to apply a voltage to the first electrode of the light detecting unit, so that the second electrode of the light detecting unit has a potential, where the potential of the second electrode changes under the action of the light irradiated to the first electrode, causing an output current of the switch unit to change;

a first determining module, configured to determine an amount of change of the output current of the switch unit; and a second determining module, configured to determine an intensity of illumination irradiated to the first electrode based on the amount of change of the output current of the switch unit.

In some embodiments, the light irradiated to the first electrode is the light reflected by a fingerprint, and the assembly for detecting light further includes:

a detecting module, configured to perform fingerprint detection based on the amount of change of the output current of a plurality of the switch units.

In a fourth aspect, a method for manufacturing an array substrate is provided.

The method for manufacturing an array substrate includes:

providing a base substrate having a pixel region;

forming a light detecting unit, a switch unit, and a light emitting unit in the pixel region so that the light detecting unit and the light emitting unit share the switch unit.

In some embodiments, forming the light detecting unit, the switch unit, and the light emitting unit in the pixel region so that the light detecting unit and the light emitting unit share the switch unit includes:

forming the light detecting unit in the pixel region;

forming the switch unit on the side of the light detecting unit away from the photosensitive side of the light detecting unit, where the switch unit is insulated from the light detecting unit, and the orthographic projection of the light detecting unit on the base substrate is at least partially overlapped with the orthographic projection of the switch unit on the base substrate; and forming the light emitting unit on the side of the switch unit away from the light detecting unit, where the light emitting unit is electrically connected to the switch unit.

In some embodiments, forming the light detecting unit in the pixel region includes:

forming a first electrode, a photosensitive layer, and a second electrode in the pixel region, where the first electrode, the photosensitive layer, and the second electrode are sequentially stacked in a direction away from the base substrate.

Forming the switch unit on the side of the light detecting unit away from the photosensitive side of the light detecting unit includes:

forming an active layer on the side of the light detecting unit away from the photosensitive side of the light detecting unit; and forming a control terminal, a first terminal, and a second terminal on the side of the active layer away from the light detecting unit, where one of the first terminal and the second terminal is a source, and the other thereof is a drain.

In some embodiments, before forming the switch unit on the side of the light detecting unit away from the photosensitive side of the light detecting unit, the method for manufacturing an array substrate further includes:

forming an insulating layer on the side of the light detecting unit away from the photosensitive side of the light detecting unit;

forming the switch unit on the side of the light detecting unit away from the photosensitive side of the light detecting unit includes:

forming the switch unit on the side of the insulating layer away from the light detecting unit.

In some embodiments, before forming the light emitting unit on the side of the switch unit away from the light detecting unit, the method for manufacturing an array substrate further includes:

forming a planarization layer on the side of the switch unit away from the light detecting unit;

forming the light emitting unit on the side of the switch unit away from the light detecting unit includes:

forming the light emitting unit on the side of the planarization layer away from the light detecting unit;

the method for manufacturing an array substrate further includes: forming a pixel defining layer on the side of the planarization layer away from the switch unit, where the light emitting unit is located in a pixel opening defined by the pixel defining layer.

In some embodiments, the method for manufacturing an array substrate further includes:

forming an encapsulation layer on the side of the light emitting unit away from the base substrate.

In a fourth aspect, a display device is provided, including the array substrate according to the first aspect or any optional manner of the first aspect.

In some embodiments, the display device further includes the assembly for detecting light according to the third aspect or any optional manner of the third aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

The accompanying drawings, which are incorporated in and constitute a part of this specification, illustrate embodiments consistent with the present disclosure, and together with the description, serve to explain the principles of the present disclosure.

DETAILED DESCRIPTION

For clearer descriptions of the principles, technical solutions and advantages of the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

With the development of display technology, the light detecting unit may be integrated on the array substrate, so that the array substrate can realize the light detection function. For example, the array substrate integrated with the light detecting unit can detect the ambient light in the environment where the array substrate is located, and again for example, the array substrate integrated with the light detecting unit can detect the light emitted from the light emitting unit of the array substrate. At present, the array substrate integrated with the light detecting unit includes: a base substrate, a light emitting unit, a light detecting unit, and a thin film transistor (TFT), where the light emitting unit, the light detecting unit and the thin film transistor are located on the base substrate, and the base substrate has a plurality of pixel regions arranged in an array. Currently, each of the pixel regions is provided with a light emitting unit, a light detecting unit and two TFTs. The two TFTs are distributed in the same layer, and the light emitting unit and the light detecting unit are independently controlled by the two TFTs respectively.

However, such an array substrate has a large number of TFTs, which results in a complex structure of the array substrate. In addition, since the two TFTs are distributed in the same layer, the light emitting unit and the light detecting unit occupy a relatively low area of the pixel region, which results in low pixel filling rates and low detection resolutions of the array substrate.

Figure 1:
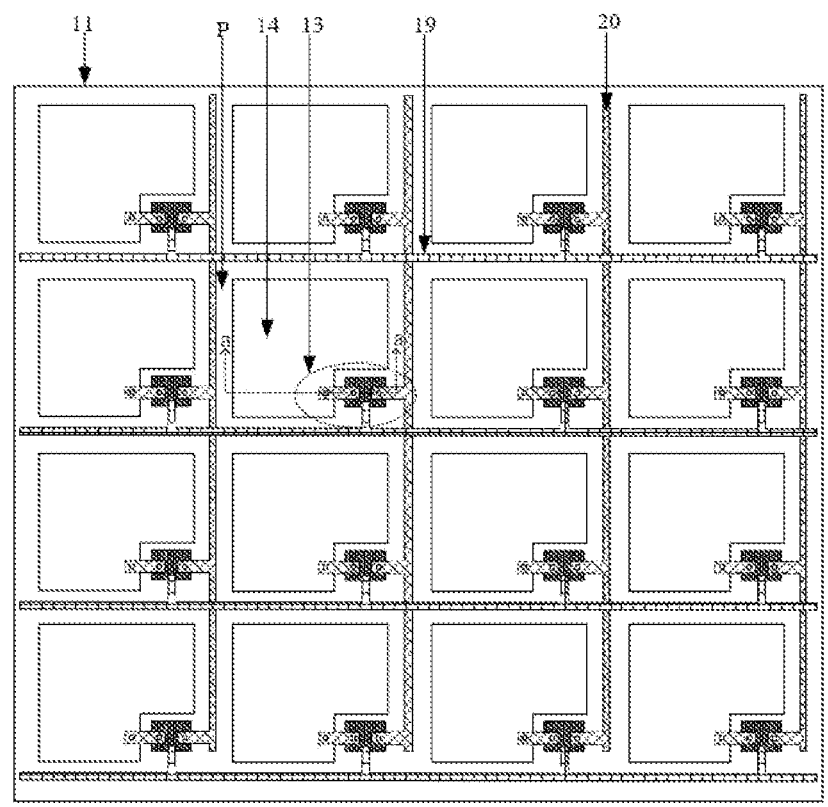
FIG. 1 is a front view of an array substrate according to an embodiment of the present disclosure.
Figure 2:
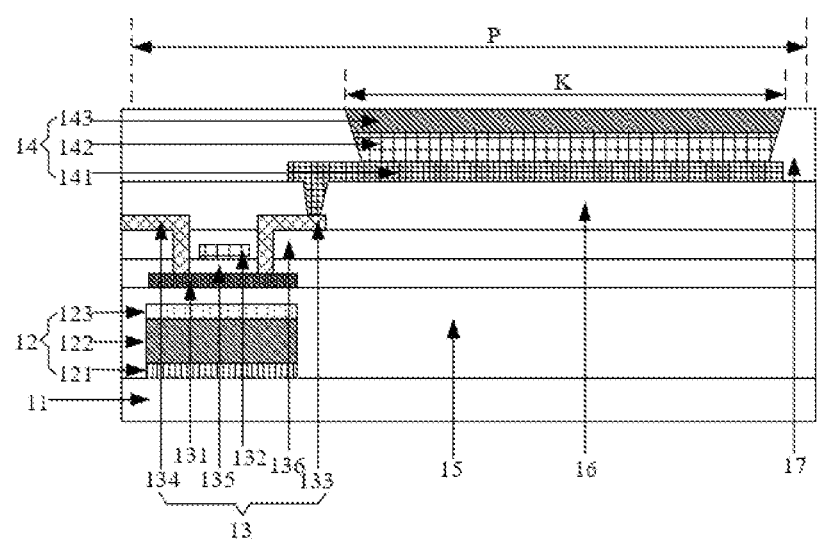
FIG. 2 is a cross-sectional view of the portion a-a of the array substrate shown in FIG. 1.

Reference is made to FIG. 1 and FIG. 2, FIG. 1 is a front view of an array substrate according to an embodiment of the present disclosure, and FIG. 2 is a cross-sectional view of the portion a-a of the array substrate shown in FIG. 1. Referring to FIG. 1 and FIG. 2, the array substrate includes: a base substrate 11 having a pixel region P; a light detecting unit 12, a switch unit 13 and a light emitting unit 14 that are located in the pixel region P. The light detecting unit 12 and the light emitting unit 14 share the switch unit 13.

Those skilled in the art can easily understand that the base substrate 11 has a plurality of pixel regions P arranged in an array. In the embodiment of the present disclosure, each of the pixel regions P is provided with a light detecting unit 12, a switch unit 13 and a light emitting unit 14, the light detecting unit 12 and the light emitting unit 14 in each of the pixel regions P share the switch unit 13 in the pixel region P.

In summary, with respect to the array substrate according to the embodiment of the present disclosure, the light emitting unit and the light detecting unit share the switch unit in the pixel region, which helps to reduce the number of the switch units on the array substrate, thereby simplifying the structure of the array substrate.

In some embodiments, the light detecting unit 12 has a photosensitive side, the switch unit 13 is located on a side away from the photosensitive side of the light detecting unit 12, the switch unit 13 is insulated from the light detecting unit 12, an orthographic projection of the light detecting unit 12 onto the base substrate 11 is at least partially overlapped with an orthographic projection of the switch unit 13 onto the base substrate 11, and the switch unit 13 is electrically connected to the light emitting unit 14. In some embodiments, the photosensitive side of the light detecting unit 12 is the side of the light detecting unit 12 close to the base substrate 11, as shown in FIG. 2, the switch unit 13 is located on the side facing away from the photosensitive side of the light detecting unit 12, that is, the switch unit 13 is located on the side of the light detecting unit 12 away from the base substrate 11. Under the irradiation of light, the light detecting unit 12 can generate current, and the current generated by the light detecting unit 12 can affect the output current of the switch unit 13. When the switch unit 13 operates in the ON transition region, the current generated by the light detecting unit 12 has significant influence on the output current of the switch unit 13. Therefore, the intensity of illumination irradiated to the light detecting unit 12 (that is, the intensity of the light irradiated to the light detecting unit 12) may be determined based on the amount of change of the output current of the switch unit 13 when the switch unit 13 operates in the ON transition region. In the embodiment of the present disclosure, the switch unit 13 may be controlled to operate in the ON transition region, so that the switch unit 13 controls the light detecting unit 12 to perform light detection; and since the switch unit 13 is electrically connected to the light emitting unit 14, the switch unit 13 can control the light emitting unit 14 to emit light, and thus the switch unit 13 can control the light detecting unit 12 and the light emitting unit 14 to realize that the light detecting unit 12 and the light emitting unit 14 share the switch unit 13. The ON transition region is the region between an ON region and an OFF region of the switch unit. For example, the region between an ON region and an OFF region of a TFT is the subthreshold swing (SS) region. When the switch unit is a TFT, the ON transition region may be the SS region.

In some embodiments, the orthographic projection of the light detecting unit 12 onto the base substrate 11 is at least partially overlapped with the orthographic projection of the switch unit 13 onto the base substrate 11. For example, the orthographic projection of the switch unit 13 onto the base substrate 11 covers the orthographic projection of the light detecting unit 12 onto the base substrate 11. Since the switch unit 13 is located on the side of the light detecting unit 12 away from the base substrate 11, and the orthographic projection of the light detecting unit 12 onto the base substrate 11 is at least partially overlapped with the orthographic projection of the switch unit 13 onto the base substrate 11, the vertical distribution of the switch unit 13 and the light detecting unit 12 helps to reduce the occupied area of the switch unit 13 in the pixel region P, and to improve the pixel filling rate and detection resolution of the array substrate. The vertical distribution refers to distribution along a direction perpendicular to the surface of the base substrate 11. It is easy to understand that, the fact that the orthographic projection of the switch unit 13 onto the base substrate 11 covers the orthographic projection of the light detecting unit 12 onto the base substrate 11, helps to reduce the occupied area of the switch unit 13 in the pixel region P to the greatest extent, and to improve the pixel filling rate and detection resolution of the array substrate.

In some embodiments, as shown in FIG. 2, the light detecting unit 12 includes a first electrode 121, a photosensitive layer 122, and a second electrode 123 that are sequentially stacked in a direction close to the switch unit 13. The switch unit 13 includes: an active layer 131, a control terminal 132, a first terminal 133, and a second terminal 134, where the control terminal 132, the first terminal 133, and the second terminal 134 are located on the side of the active layer 131 away from the light detecting unit 12; one of the first terminal 133 and the second terminal 134 is the source, and the other thereof is the drain, and the first terminal 133 and the second terminal 134 are electrically connected to the active layer 131 respectively. Since the array substrate determines the intensity of illumination irradiated to the light detecting unit 12 based on the influence of the current generated by the light detecting unit 12 on the output current of the switch unit 13 under the irradiation of light, and thus the light detection is performed, and the output current of the switch unit 13 is related to the active layer 131, if the control terminal 132 is located on the side of the active layer 131 close to the light detecting unit 12, the control terminal 132 will shield the active layer 131, which causes the influence of the current generated by the light detecting unit 12 on the output current of the switch unit 13 to be reduced or even disappeared, and thus it is difficult to realize light detection. In the embodiment of the present disclosure, the control terminal 132 is located on the side of the active layer 131 away from the light detecting unit 12, which helps to prevent the control terminal 132 from shielding the active layer 131, thereby avoiding the influence of the current generated by the light detecting unit 12 on the output current of the switch unit 13 to be reduced or even disappeared, and thus it is easy to realize light detection. In the embodiment of the present disclosure, the light irradiated to the light detecting unit 12 may be the light emitted from the light emitting unit 14 or the light in the environment where the array substrate is located, which is not limited in the embodiment of the present disclosure.

In some embodiments, the light detecting unit 12 may be a photodiode, the photosensitive layer 122 may be a PIN layer, and the switch unit 13 may be a TFT. The control terminal 132 may be the gate, the first terminal 133 may be the drain, and the second terminal 134 may be the source. The first terminal 133 and the second terminal 134 may be distributed in the same layer, and the first terminal 133 and the second terminal 134 may be prepared through the same one patterning process. As shown in FIG. 2, the switch unit 13 further includes a gate insulating layer 135 located between the active layer 131 and the control terminal 132, and an interlayer dielectric layer 136 located between the control terminal 132 and the first terminal 133 and the second terminal 134. Each of the gate insulating layer 135 and the interlayer dielectric layer 136 has a communicable first connection hole (for example, a drain via) and a communicable second connection hole (for example, a source via). The first terminal 133 is electrically connected to the active layer 131 sequentially through the first connection hole in the interlayer dielectric layer and the first connection hole in the gate insulating layer 135, and the second terminal 134 is electrically connected to the active layer 131 sequentially through the second connection hole in the interlayer dielectric layer and the second connection hole in the gate insulating layer 135.

In some embodiments, the second electrode 123 may be made of a light-shielding material, and the orthographic projection of the second electrode 123 onto the base substrate 11 is at least partially overlapped with the orthographic projection of the active layer 131 onto the base substrate 11. In some embodiments, the orthographic projection of the second electrode 123 onto the base substrate 11 covers the orthographic projection of the active layer 131 onto the base substrate 11. In this way, the second electrode 123 may be used as a light shield (LS) layer to shield the active layer 131, which prevents light from irradiating from the side where the base substrate 11 is located to the active layer 131 to affect the characteristics of the active layer 131, thereby avoiding the influence of illumination on the switching characteristics of the switch unit 13.

In some embodiments, the first electrode 121 may be made of transparent conductive materials such as indium tin oxide (ITO), indium zinc oxide (IZO) or aluminum-doped zinc oxide (ZnO:Al). The thickness of the first electrode 121 may range from 50 nm to 130 nm (nanometer); the photosensitive layer 122 (for example, the PIN layer) may include a P-type semiconductor layer, an intrinsic semiconductor layer, and an N-type semiconductor layer that are sequentially stacked. The P-type semiconductor layer may be close to the first electrode 121 or far away from the first electrode 121 relative to the N-type semiconductor layer. The P-type semiconductor layer may be a P-type doped amorphous-silicon (a-Si) film layer, and the thickness of the P-type semiconductor layer may range from 10 nm to 20 nm. The intrinsic semiconductor layer may be an a-Si film layer, and the thickness of the intrinsic semiconductor layer may range from 500 nm to 1000 nm. The N-type semiconductor layer may be an N-type doped a-Si film layer, and the thickness of the N-type semiconductor layer may range from 10 nm to 20 nm. For example, the P-type semiconductor layer is doped with boron ions, and the N-type semiconductor layer is doped with phosphorus ions. The second electrode 123 may be made of magnesium (Mg), silver (Ag), molybdenum (Mo), copper (Cu), aluminum (Al), gold (Au) and alloy materials thereof, and the thickness of the second electrode 123 may range from 200 nm to 400 nm.

In some embodiments, the active layer 131 may be an oxide active layer, an a-Si active layer, or a p-Si active layer. The oxide active layer is for example an indium gallium zinc oxide (IGZO) active layer or an indium tin zinc oxide (ITZO) active layer. The portion of the active layer 131 connected to the first terminal 133 or the second terminal 134 is metallized, so as to increase the carrier concentration of the portion and to ensure an ohmic contact between the portion and the corresponding electrode (for example, the first terminal or the second terminal). The gate insulating layer 135 may be made of transparent insulating materials such as silicon dioxide ($SiO_2$), silicon oxide ($SiO_x$), silicon nitride ($SiN_x$), aluminium oxide ($Al_2O_3$) or silicon oxynitride ($SiO_xN_x$); the gate insulating layer 135 may be a single-layered or multi-layered structure, for example, the gate insulating layer 135 may be a $SiO_2$ single-layered structure or a $SiN/SiO_2$ multi-layered structure (that is, a multi-layered structure formed by alternately stacking SiN film layers and $SiO_2$ film layers); and the thickness of the gate insulating layer 135 may range from 80 nm to 150 nm. The control terminal 132 may be made of Mo, Cu, Al, Au and alloy materials thereof; and the thickness of the control terminal 132 may range from 200 nm to 400 nm. The interlayer dielectric layer 136 may be made of transparent insulating materials such as $SiO_2$, $SiO_x$, $SiN_x$, $Al_2O_3$ or $SiO_xN_x$; the interlayer dielectric layer 136 may be a single-layered or multi-layered structure, for example, the interlayer dielectric layer 136 may be a $SiO_2$ single-layered structure or a $SiN/SiO_2$ multi-layered structure; and the thickness of the interlayer dielectric layer 136 may range from 80 nm to 150 nm. The first terminal 133 and the second terminal 134 may both be made of Mg, Ag, Mo, Cu, Al, Au and alloy materials thereof; and the thickness of the first terminal 133 and the thickness of the second terminal 134 may range from 200 nm to 400 nm.

In some embodiments, the light emitting unit 14 may be an electroluminescent unit, as shown in FIG. 1, the light emitting unit 14 includes an anode 141, an electroluminescent layer 142, and a cathode 143 that are sequentially stacked in a direction away from the base substrate 11, and the anode 141 is electrically connected to the first terminal 133. The electroluminescent unit may be an organic light emitting diode (OLED) unit or a quantum dot light emitting diode (QLED) unit. The anode 141 may be made of Mg, Ag, Mo, Cu, Al, Au and alloy materials thereof. The cathode 143 may be made of conductive materials such as ITO, IZO or metal Ag; and for example, the cathode 143 is an ITO/Ag/ITO multi-layered structure, where the thickness of the ITO film layer is 8 nm, and the thickness of the Ag film layer is 100 nm. Those skilled in the art can easily understand that, the electroluminescent unit includes two electrodes and an electroluminescent layer sandwiched between the two electrodes. The embodiment of the present disclosure is described by taking an example in which the two electrodes includes an anode 141 and a cathode 143, and the anode is electrically connected to the first terminal 133 of the switch unit 13, and the cathode is not electrically connected to the switch unit 13. In actual applications, the cathode may be electrically connected to the first terminal 133 of the switch unit 13, and the anode may be not electrically connected to the switch unit 13, and in different scenarios, the names of the above two electrodes may also be other names. Furthermore, the light emitting unit 14 shown in FIG. 1 and FIG. 2 is only exemplary. In actual applications, the light emitting unit 14 may also include a hole injection layer, a hole transport layer, an electron transport layer, and an electron injection layer, which will not be repeated in the embodiment of the present disclosure.

In some embodiments, as shown in FIG. 1, the array substrate further includes a plurality of gate lines 19 and a plurality of data lines 20, and the plurality of gate lines 19 and the plurality of data lines 20 are insulated and crossed to define a plurality of pixel regions P, The control terminal 132 (for example, the gate) of the switch unit 13 may be electrically connected to the gate line 19, the second terminal 134 (for example, the source) of the switch unit 13 may be electrically connected to the data line 20, The gate line 19 is used to apply a control voltage to the control terminal 132, and the data line 20 is used to apply a data voltage to the second terminal 134. In some embodiments, the gate line 19 and the control terminal 132 may be distributed in the same layer, and the gate line 19 and the control terminal 132 may be prepared through the same one patterning process. The data line 20 and the second terminal 134 are distributed in the same layer, and the data line 20 and the second terminal 134 may be prepared through the same one patterning process.

In some embodiments, as shown in FIG. 2, the array substrate further includes an insulating layer 15 located between the light detecting unit 12 and the switch unit 13; a planarization layer 16 located between the switch unit 13 and the light emitting unit 14; and a pixel defining layer 17 located on the side of the planarization layer 16 away from the switch unit 13. The pixel defining layer 17 defines a pixel opening K, the orthographic projection of the pixel opening K onto the base substrate 11 is located within the pixel region P, and the light emitting unit 14 is located within the pixel opening K defined by the pixel defining layer 17. The insulating layer 15 may include an organic insulating layer and an inorganic insulating layer that are stacked. The organic insulating layer may be made of resin, and the difference between the thickness of the organic insulating layer and the thickness of the light detecting unit 12 may range from 1.2 μm to 3 μm (micrometers). The inorganic insulating layer may be a single-layered or multi-layered structure, for example, the inorganic insulating layer may be an $SiO_2$ single-layered structure or a $SiN/SiO_2$ multi-layered structure. The planarization layer 16 may be made of resin, and the thickness of the planarization layer 16 may range from 2 μm to 3 μm. The pixel defining layer 17 may be made of resin with strong liquid repellency (for example, hydrophobicity). The electroluminescent layer 142 is usually formed by an inkjet printing process or a solution-based process. The pixel defining layer 17 being made of resin with strong liquid repellency can facilitate printing of the solution in the pixel opening K, so that the pixel defining layer 17 can define the light emitting unit 14 within the pixel opening K.

Figure 3:
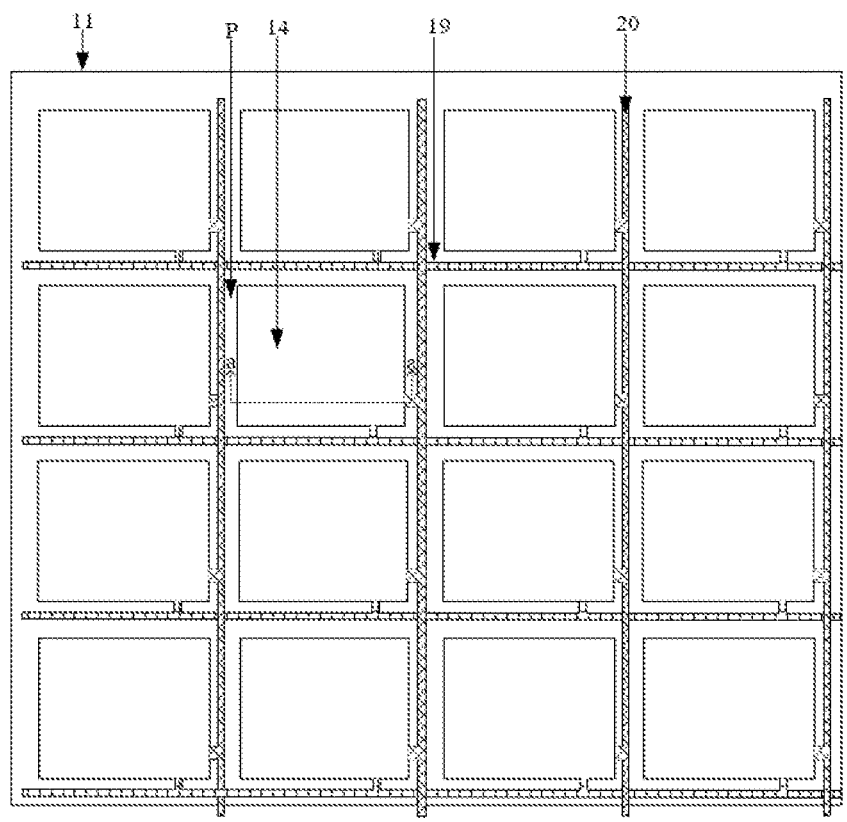
FIG. 3 is a front view of another array substrate according to an embodiment of the present disclosure.
Figure 4:
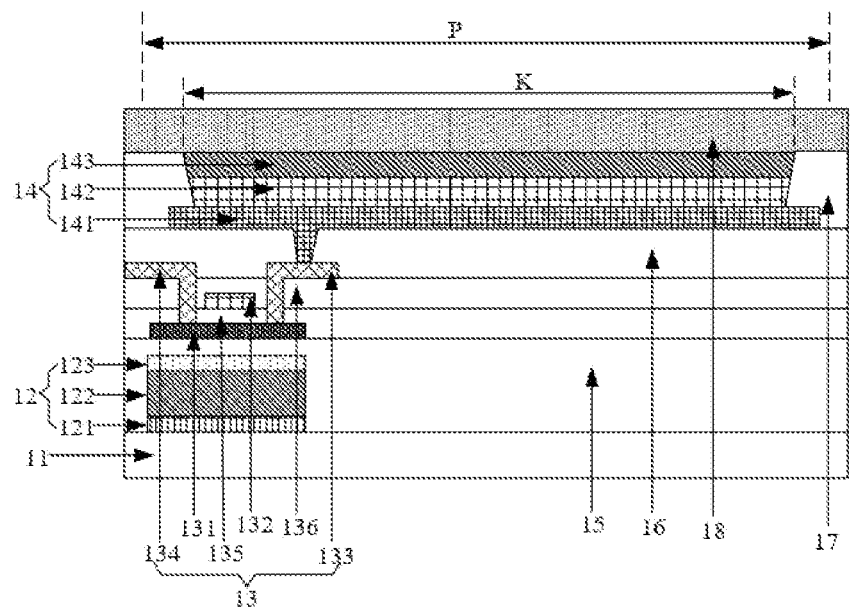
FIG. 4 is a cross-sectional view of the portion a-a of the array substrate shown in FIG. 3.

In some embodiments, as shown in FIG. 2, the light detecting unit 12, the switch unit 13, and the light emitting unit 14 are sequentially distributed along a direction away from the base substrate 11. Reference is made to FIG. 3 and FIG. 4, FIG. 3 is a front view of another array substrate according to an embodiment of the present disclosure, and FIG. 4 is a cross-sectional view of the portion a-a of the array substrate shown in FIG. 3. Reference is made to FIG. 4 on the basis of FIG. 2, the array substrate further includes an encapsulation layer 18 which is located on the side of the light emitting unit 14 away from the base substrate 11. The encapsulation layer 18 covers the light emitting unit 14 and the pixel defining layer 17, and the encapsulation layer 18 is used to encapsulate the light emitting unit 14 of the array substrate. In some embodiments, the encapsulation layer 18 may be a thin film encapsulation (TFE) layer or an encapsulation cover plate. The TFE layer may include an inorganic layer and an organic layer that are alternately stacked. The inorganic layer may be made of transparent insulating materials such as $SiO_2$, $SiO_x$, $SiN_x$, $Al_2O_3$, or $SiO_xN_x$, the organic layer may be made of organic resin, and the encapsulation cover plate may be a cover plate made of materials such as glass, which is not limited in the embodiments of the present disclosure.

The array substrate according to the embodiments of the present disclosure may be a bottom emission array substrate or a top emission array substrate. When the switch unit and the light emitting unit are distributed in a direction away from the base substrate, in the bottom emission array substrate, there is no overlapping region between the orthographic projection of the switch unit onto the base substrate and the orthographic projection of the light emitting unit onto the base substrate, which avoids the switch unit from shielding the light emitted from the light emitting unit so as to affect the light output rate of the array substrate. In the top emission array substrate, even there is an overlapping region between the orthographic projection of the switch unit onto the base substrate and the orthographic projection of the light emitting unit onto the base substrate, the switch unit does not shield the light emitted from the light emitting unit, which does not affect the light output rate of the array substrate. The top emission array substrate has a higher aperture ratio relative to the bottom emission array substrate. Exemplarily, the bottom emission array substrate may be as shown in FIG. 1 and FIG. 2, and the top emission array substrate may be as shown in FIG. 3 and FIG. 4. Those skilled in the art can easily understand that, the array substrate shown in FIG. 1 to FIG. 4 are only exemplary. In actual applications, both the bottom emission array substrate and the top emission array substrate may include an encapsulation layer. Furthermore, in addition to the structures shown in FIG. 1 to FIG. 4, the array substrate may further include a pixel circuit and a protective layer which is located on the sidewall of the photosensitive layer. The protective layer may be made of silicon oxide (SiO), silicon nitride (SiN), and the thickness of the protective layer may range from 50 nm to 150 nm, which will not be repeated in the embodiment of the present disclosure.

In the embodiment of the present disclosure, the light detecting unit 12 may perform light detection under the control of the switch unit 13. The principle of light detection performed by the light detecting unit 12 will be described below with reference to FIG. 1 to FIG. 4.

Figure 5:
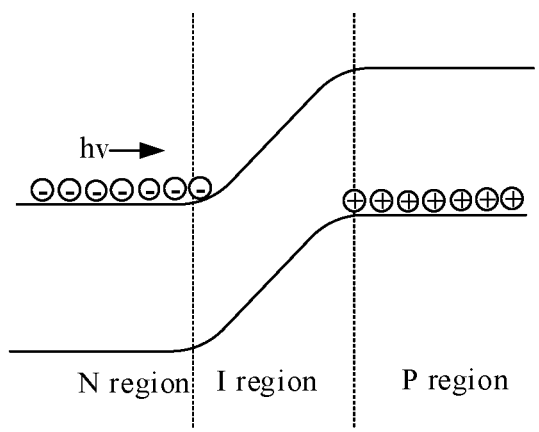
FIG. 5 is a principle diagram of light detection performed by a light detecting unit according to an embodiment of the present disclosure.

The light detecting unit 12 is a photodiode with a PIN layer (that is, the photosensitive layer 122). The light detecting unit 12 may also be called a PIN junction photodiode. The light detecting unit 12 is very sensitive to illumination and can accurately sense a light signal, and can convert the light signal into an electrical signal based on the photovoltaic effect. In the light detecting unit 12, the first electrode 121 is used to sense a light signal, and thus the first electrode 121 may be called a photosensitive electrode (or called a photosensitive surface, etc.) of the light detecting unit 12. Reference is made to FIG. 5 that shows a principle diagram of light detection performed by a light detecting unit 12 according to an embodiment of the present disclosure. In FIG. 5, the P region corresponds to the P-type semiconductor layer of the light detecting unit 12, the I region corresponds to the intrinsic semiconductor layer of the light detecting unit 12, and the N region corresponds to the N-type semiconductor layer of the light detecting unit 12. The operating principle of the light detecting unit 12 is as follows: when light is irradiated onto the first electrode 121, the energy of the light causes the electrons in the P region and the electrons in the N region to transfer to generate electron-hole pairs. Under the action of the internal electric field of the I region, the electrons (the energy thereof is hv) move toward the positively charged N region and are accumulated in the N region, the holes move toward the negatively charged P region and are accumulated in the P region, which causes a voltage difference (also called a photo-generated bias) between the P region and the N region, each of the first electrode 121 and the second electrode 123 (that is, the LS layer) has a certain potential.

Figure 6:
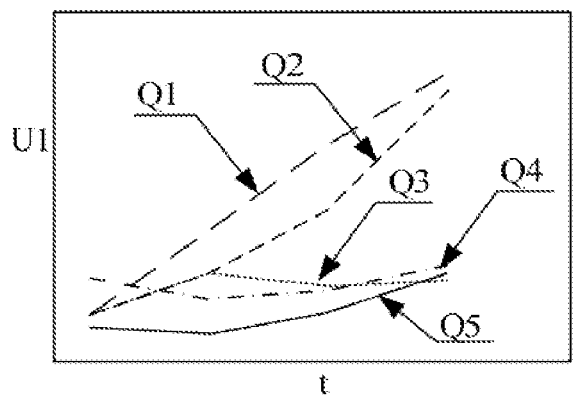
FIG. 6 is a graph showing the illumination time versus the potential of the first electrode according to an embodiment of the present disclosure.

Reference is made to FIG. 6 that shows a graph of the illumination time t versus the potential U1 of the first electrode 121 when the light is irradiated to the first electrode 121, where the curve Q1 represents the relationship between the illumination time t versus the potential U1 of the first electrode 121 when the light with a wavelength of 600 nanometers is irradiated to the first electrode 121, the curve Q2 represents the relationship between the illumination time t versus the potential U1 of the first electrode 121 when the light with a wavelength of 800 nanometers is irradiated to the first electrode 121, the curve Q3 represents the relationship between the illumination time t versus the potential U1 of the first electrode 121 when the light with a wavelength of 900 nanometers is irradiated to the first electrode 121, the curve Q4 represents the relationship between the illumination time t versus the potential U1 of the first electrode 121 when the light with a wavelength of 1200 nanometers is irradiated to the first electrode 121, and the curve Q5 represents the relationship between the illumination time t versus the potential U1 of the first electrode 121 when the white light is irradiated to the first electrode 121. As can be seen from FIG. 6, when the light with different wavelengths is irradiated to the first electrode 121, the potential U1 generated by the first electrode 121 is different.

Figure 7:
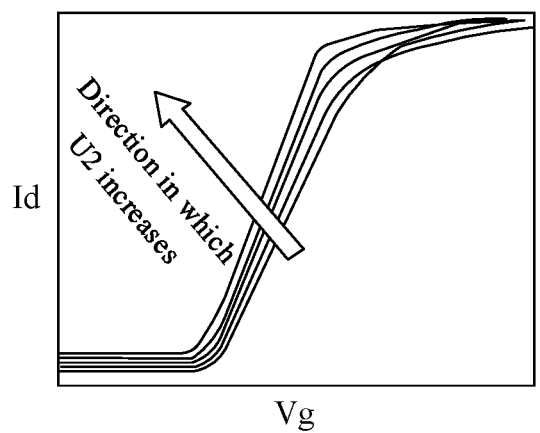
FIG. 7 is a graph showing the control voltage of the switch unit versus the output current of the switch unit according to an embodiment of the present disclosure.

Illumination can cause the potential of the first electrode 121 and the potential of the second electrode 123 (that is, the LS layer) to change, and the change of the potential of the second electrode 123 may cause the control voltage Vg of the switch unit 13 (that is, the voltage of the control terminal 132, for example the gate voltage) to change, the change of the control voltage Vg of the switch unit 13 may cause the output current Id of the switch unit 13 to change. Therefore, the intensity of illumination irradiated to the first electrode 121 (that is, the intensity of the light irradiated to the first electrode 121) may be determined based on the amount of change of the output current Id of the switch unit 13 caused by illumination, so as to realize light detection. Reference is made to FIG. 7 that shows a graph of the control voltage Vg of the switch unit 13 versus the output current Id of the switch unit 13. U2 represents the potential of the second electrode 123, each of the curves corresponds to one U2, and U2 increases in the direction indicated by the arrow. It can be seen that the curves corresponding to different U2 are different, and thus the potential of the second electrode 123 has significant influence on the threshold voltage Vth of the switch unit 13.

Figure 8:
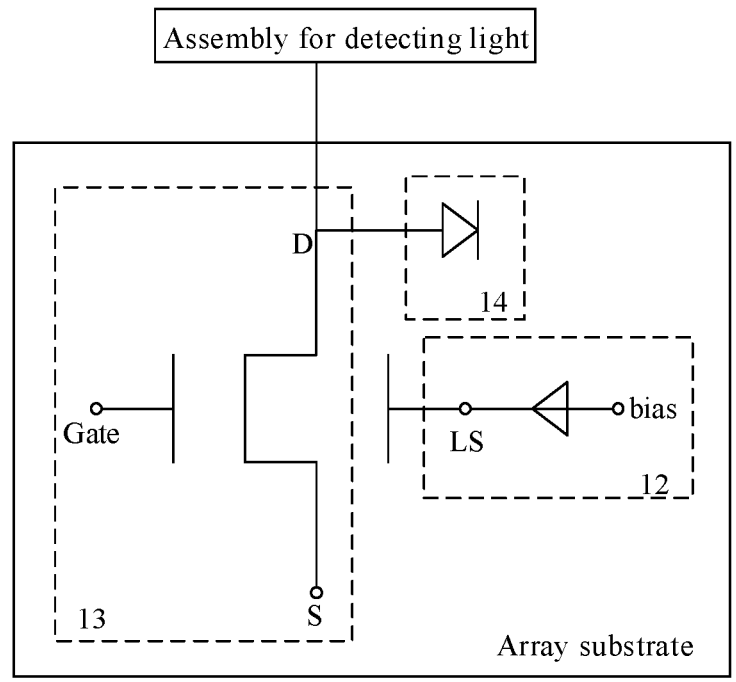
FIG. 8 is an equivalent circuit diagram of an array substrate according to an embodiment of the present disclosure.
Figure 9:
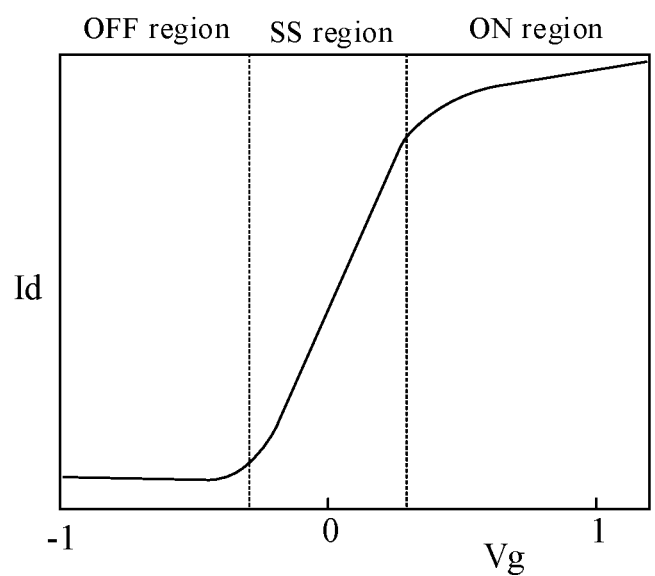
FIG. 9 is a graph of the transfer characteristics of the switch unit according to an embodiment of the present disclosure.

Reference is made to FIG. 8 that shows an equivalent circuit diagram of an array substrate according to an embodiment of the present disclosure. In FIG. 8, bias represents the first electrode 121 of the light detecting unit 12, and LS represents the second electrode 123 of the light detecting unit 12. The control terminal (for example, the gate) of the switch unit 13 is electrically connected to the gate line (not shown in FIG. 8) in the array substrate, the second terminal S (for example, the source) of the switch unit 13 is electrically connected to the data line (not shown in FIG. 8) in the array substrate, and the first terminal D (for example, the drain) of the switch unit 13 is electrically connected to the light emitting unit 14. Furthermore, the first terminal D of the switch unit 13 is also electrically connected to an assembly for detecting light located outside the array substrate. The assembly for detecting light may be a chip or a functional component in the chip, and the chip may be an integrated circuit chip. Reference is made to FIG. 9 that shows a graph of the transfer characteristics of the switch unit 13 according to an embodiment of the present disclosure. FIG. 9 takes the switch unit 13 being a TFT as an example, and the ON transition region of the switch unit 13 is the SS region. When the light is irradiated to the first electrode 121 of the light detecting unit 12, the photo-generated bias generated by the light detecting unit 12 has little influence on the switch unit 13, and thus the amount of change of the output current Id of the switch unit 13 is usually small. When the switch unit 13 operates in the OFF region or in the ON region, the amount of change of the output current Id of the switch unit 13 caused by the light irradiated to the first electrode 121 of the light detecting unit 12 is usually difficult to measure. When the switch unit 13 operates in the SS region, the amount of change of the output current Id of the switch unit 13 caused by the light irradiated to the first electrode 121 of the light detecting unit 12 is easy to measure, and thus the intensity of illumination irradiated to the first electrode 121 of the light detecting unit 12 may be determined based on the amount of change of the output current Id of the switch unit 13 caused by the light irradiated to the first electrode 121 of the light detecting unit 12 when the switch unit 13 operates in the SS region, that is, the switch unit 13 may be controlled to operate in the SS region, so that the switch unit 13 is used to control the light detecting unit 12 to perform light detection. The process of determining the intensity of illumination based on the amount of change of the output current Id of the switch unit 13 caused by the light irradiated to the first electrode 121 of the light detecting unit 12 may be performed by the assembly for detecting light shown in FIG. 8. With reference to FIG. 8 and FIG. 9, in the embodiment of the present disclosure, when the switch unit 13 operates in the ON region, the switch unit 13 is in the on state, and the switch unit 13 controls the light emitting unit 14 to emit light; when the switch unit 13 operates in the OFF region, the switch unit 13 is in the off state; and when the switch unit 13 operates in the SS region, the switch unit 13 is between the on state and the off state, and the switch unit 13 controls the light detecting unit 12 to perform light detection.

The process of controlling the light emitting unit 14 by the switch unit 13 to emit light and the process of controlling the light detecting unit 12 by the switch unit 13 to perform light detection are described below with reference to FIG. 1 to FIG. 9.

The process of controlling the light detecting unit 12 by the switch unit 13 to perform light detection may include: firstly, applying a positive voltage to the first electrode 121 (that is, the bias) of the light detecting unit 12 to make the PIN layer (that is, the photosensitive layer 122) be forwardly biased, so as to remove the residual charge in the PIN layer (which is equivalent to a wire when the PIN layer is forwardly biased, and thus the charge stored in the PIN layer is discharged); then, applying a control voltage Vg to the switch unit 13 to make the switch unit 13 operate in the SS region, and applying a negative voltage to the first electrode 121 of the light detecting unit 12 to make the PIN layer be reversely biased; the PIN layer is equivalent to a capacitor when the PIN layer is reversely biased, and can store charge. When the light is irradiated to the first electrode 121, the PIN layer stores charge and generates a bias voltage (which may refer to the operating principle of the light detecting unit 12 described above), so that the potential of the second electrode 123 changes, thereby causing the threshold voltage Vth of the switch unit 13 to drift. In the case that the threshold voltage Vth of the switch unit 13 drifts and the control voltage Vg of the switch unit 13 does not change, the output current Id of the switch unit 13 will change in the SS region, and the amount of change of the output current Id of the switch unit 13 before illumination and after illumination may be determined, and the intensity of illumination irradiated to the first electrode 121 may be determined based on the amount of change of the output current Id of the switch unit 13 before illumination and after illumination. The experiments have proved that the signal intensity detected by the array substrate according to the embodiments of the present disclosure is 2 to 3 orders of magnitude, or even 4 orders of magnitude greater than the signal intensity detected by the traditional array substrate. Therefore, the array substrate according to the embodiments of the present disclosure is beneficial to implement high-resolution detection.

The process of controlling the light emitting unit 14 by the switch unit 13 to emit light may include: applying a control voltage Vg to the switch unit 13 to make the switch unit 13 operate in the ON region, and applying a positive voltage to the first electrode 121 of the light detecting unit 12 to make the PIN layer be forwardly biased. At this time, the switch unit 13 controls the light emitting unit 14 to turn on so that the light emitting unit 14 emits light. When the switch unit 13 operates in the ON region, the voltage difference generated in the PIN layer has little or no influence on the output current of the switch unit 13. Thus, when the switch unit 13 operates in the ON region, the photo-generated bias of the PIN layer has no influence on the light emitting effect of the light emitting unit 14, and thus has no influence on the display effect of the array substrate. Therefore, the light detecting unit 12 and the light emitting unit 14 may share the switch unit 13.

In summary, with respect to the array substrate according to the embodiment of the present disclosure, the light emitting unit and the light detecting unit share the switch unit in the pixel region, which helps to reduce the number of the switch units on the array substrate, thereby simplifying the structure of the array substrate.

The following is an embodiment of the method for manufacturing an array substrate according to the present disclosure. For the method and principle for manufacturing an array substrate according to the present disclosure, reference may be made to the descriptions in the following embodiments.

Figure 10:
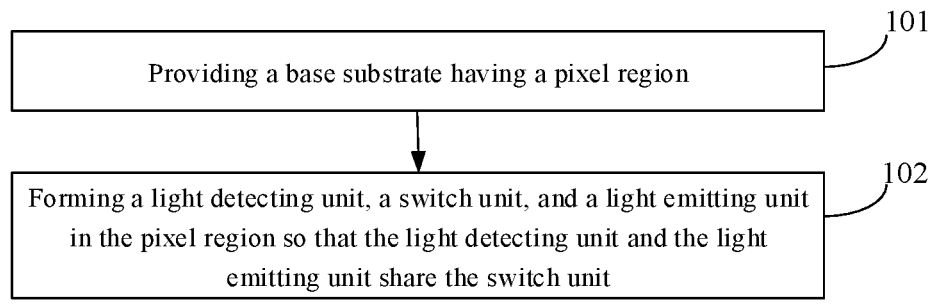
FIG. 10 is a flow chart of a method for manufacturing an array substrate according to an embodiment of the present disclosure.

Reference is made to FIG. 10 that shows a flow chart of a method for manufacturing an array substrate according to an embodiment of the present disclosure. The method for manufacturing an array substrate may be used to manufacture the array substrate shown in FIG. 1 or FIG. 4. Referring to FIG. 10, the method for manufacturing an array substrate may include step 101 and step 102.

In step 101, a base substrate having a pixel region is provided.

In step 102, a light detecting unit, a switch unit, and a light emitting unit are formed in the pixel region so that the light detecting unit and the light emitting unit share the switch unit.

In summary, with respect to the method for manufacturing an array substrate according to the embodiment of the present disclosure, the light emitting unit and the light detecting unit share the switch unit in the pixel region, which helps to reduce the number of the switch units on the array substrate, thereby simplifying the structure of the array substrate.

In some embodiments, step 102 includes:
forming a light detecting unit in the pixel region;
forming a switch unit on the side of the light detecting unit away from the photosensitive side of the light detecting unit, where the switch unit is insulated from the light detecting unit, and the orthographic projection of the light detecting unit onto the base substrate is at least partially overlapped with the orthographic projection of the switch unit onto the base substrate; and forming a light emitting unit on the side of the switch unit away from the light detecting unit, where the light emitting unit is electrically connected to the switch unit.

In some embodiments, forming the light detecting unit in the pixel region includes:

forming a first electrode, a photosensitive layer, and a second electrode in the pixel region, where the first electrode, the photosensitive layer, and the second electrode are sequentially stacked in a direction away from the base substrate;

forming the switch unit on the side of the light detecting unit away from the photosensitive side of the light detecting unit includes:

forming an active layer on the side of the light detecting unit away from the photosensitive side of the light detecting unit; and forming a control terminal, a first terminal, and a second terminal on the side of the active layer away from the light detecting unit.

In some embodiments, the second electrode is made of a light-shielding material, and an orthographic projection of the second electrode onto the base substrate is at least partially overlapped with an orthographic projection of the active layer onto the base substrate.

In some embodiments, the orthographic projection of the second electrode onto the base substrate covers the orthographic projection of the active layer onto the base substrate.

In some embodiments, before forming the switch unit on the side of the light detecting unit away from the photosensitive side of the light detecting unit, the method for manufacturing an array substrate further includes:

forming an insulating layer on the side of the light detecting unit away from the photosensitive side of the light detecting unit.

Correspondingly, forming the switch unit on the side of the light detecting unit away from the photosensitive side of the light detecting unit includes:

forming the switch unit on the side of the insulating layer away from the light detecting unit.

In some embodiments, before forming the light emitting unit on the side of the switch unit away from the light detecting unit, the method for manufacturing an array substrate further includes:

forming a planarization layer on the side of the switch unit away from the light detecting unit.

Correspondingly, forming the light emitting unit on the side of the switch unit away from the light detecting unit includes:

forming the light emitting unit on the side of the planarization layer away from the light detecting unit.

The method for manufacturing an array substrate further includes: forming a pixel defining layer on the side of the planarization layer away from the switch unit, where the light emitting unit is located in a pixel opening defined by the pixel defining layer.

In some embodiments, the method for manufacturing an array substrate further includes: forming an encapsulation layer on the side of the light emitting unit away from the planarization layer.

All the above-mentioned optional technical solutions may be combined in any way to form an optional embodiment of the present disclosure, which will not be repeated here.

Figure 11:
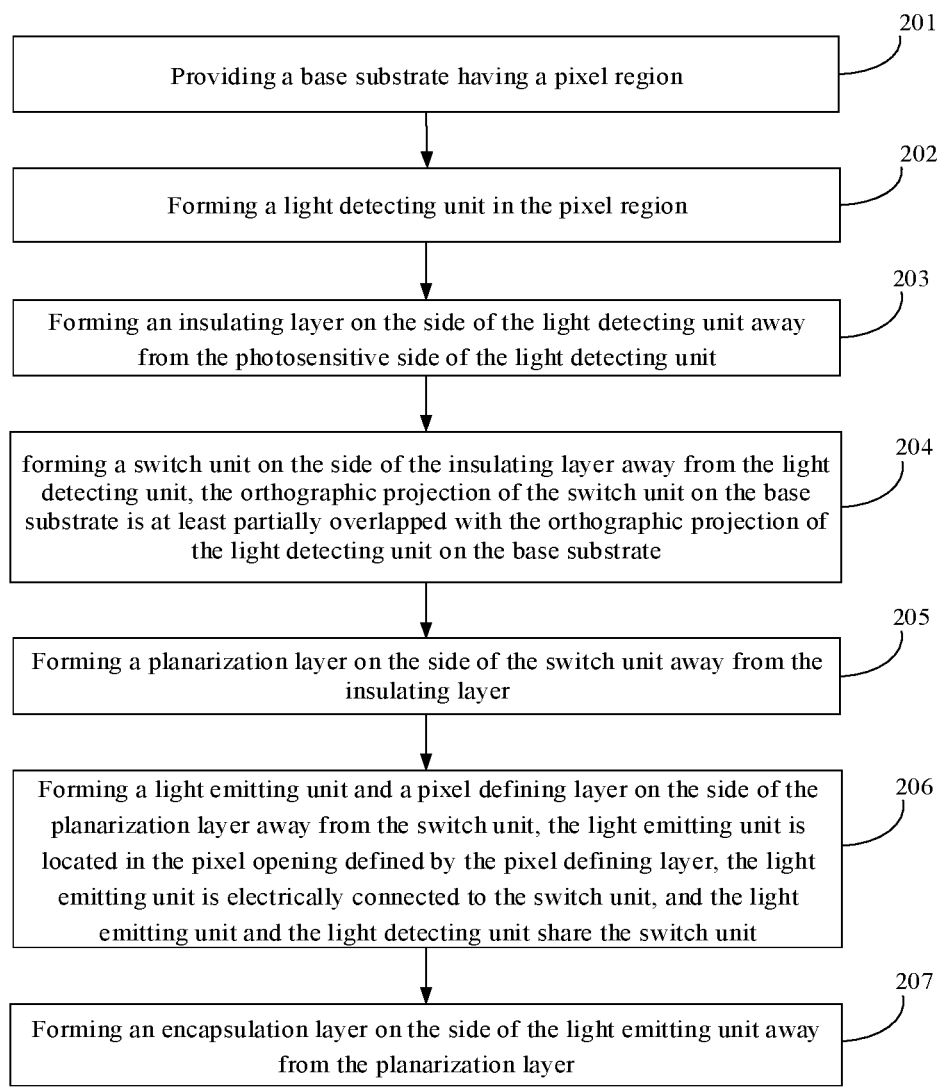
FIG. 11 is a flow chart of another method for manufacturing an array substrate according to an embodiment of the present disclosure.

Reference is made to FIG. 11 that shows a flow chart of another method for manufacturing an array substrate according to an embodiment of the present disclosure. The method for manufacturing an array substrate may be used to manufacture the array substrate shown in FIG. 1 or FIG. 3. The embodiment of the present disclosure takes the manufacture of the array substrate shown in FIG. 3 as an example for description. Referring to FIG. 11, the method for manufacturing an array substrate may include steps 201 to 207.

In step 201, a base substrate having a pixel region is provided.

The base substrate may be a transparent substrate. For example, the base substrate may be a rigid substrate made of optically transmissive and non-metallic materials with a certain degree of robustness, such as glass, quartz, or transparent resin; or, the base substrate is a flexible substrate made of flexible materials such as polyimide (PI).

In step 202, a light detecting unit is formed in the pixel region.

Figure 12:
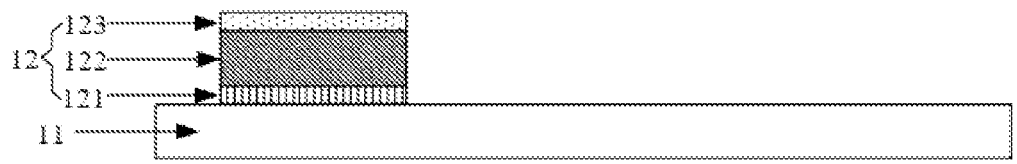
FIG. 12 to FIG. 16 are schematic diagrams of a process for manufacturing an array substrate according to an embodiment of the present disclosure.

Reference is made to FIG. 12 that shows a schematic diagram of the light detecting unit 12 being formed on the base substrate 11 according to an embodiment of the present disclosure. The light detecting unit 12 includes a first electrode 121, a photosensitive layer 122, and a second electrode 123 that are sequentially stacked in a direction away from the base substrate 11. The photosensitive layer 122 may be a PIN layer, including a P-type semiconductor layer, an intrinsic semiconductor layer, and an N-type semiconductor layer that are sequentially stacked. The P-type semiconductor layer may be close to the first electrode 121 or far away from the first electrode 121 relative to the N-type semiconductor layer. The P-type semiconductor layer may be a P-type doped a-Si film layer, and the thickness of the P-type semiconductor layer may range from 10 nm to 20 nm. The intrinsic semiconductor layer may be an a-Si film layer, and the thickness of the intrinsic semiconductor layer may range from 500 nm to 1000 nm. The N-type semiconductor layer may be an N-type doped a-Si film layer, and the thickness of the N-type semiconductor layer may range from 10 nm to 20 nm. The first electrode 121 may be made of transparent conductive materials such as ITO, IZO, or ZnO: Al, and the thickness of the first electrode 121 may range from 50 nm to 130 nm. The second electrode 123 is made of a light-shielding material such as Mo, Cu, Al, Au and alloy materials thereof, and the thickness of the second electrode 123 may range from 200 nm to 400 nm.

Exemplarily, in the case that the P-type semiconductor layer may be close to the first electrode 121 relative to the N-type semiconductor layer, forming the light detecting unit 12 in the pixel region may include the following step (1) to step (3).

In step (1), an ITO material layer with a thickness between 50 nm and 130 nm is formed on the base substrate 11 by any of the processes such as magnetron sputtering, thermal evaporation, or plasma enhanced chemical vapor deposition (PECVD), and the ITO material layer is processed by a one-time patterning process to obtain a first electrode 121, the first electrode 121 is located in the pixel region of the base substrate 11.

In step (2), a P-type semiconductor material layer with a thickness between 10 nm and 20 nm, an intrinsic semiconductor material layer with a thickness between 500 nm and 1000 nm, and an N-type semiconductor material layer with a thickness between 10 nm and 50 nm are sequentially formed on the side of the first electrode 121 away from the base substrate 11. The P-type semiconductor material layer, the intrinsic semiconductor material layer, and the N-type semiconductor material layer are processed by a one-time patterning process to obtain the P-type semiconductor layer, the intrinsic semiconductor layer and the N-type semiconductor layer that are sequentially stacked with the first electrode 121, so as to obtain the photosensitive layer 122

(that is, the PIN layer 122). Forming the P-type semiconductor material layer may include: firstly, depositing an intrinsic semiconductor material by a PECVD process to form an intrinsic semiconductor material layer, and then performing a P-type doping on the intrinsic semiconductor material layer to obtain a P-type semiconductor material layer; or firstly, performing a P-type doping on an intrinsic semiconductor material to obtain a P-type semiconductor material, and then depositing a P-type semiconductor material by a PECVD process to obtain a P-type semiconductor material layer. The process of forming the N-type semiconductor material layer is similar to this, and will not be repeated here. It is easy for those skilled in the art to understand that the embodiment of the present disclosure is described by taking an example in which the P-type semiconductor layer, the intrinsic semiconductor layer, and the N-type semiconductor layer are simultaneously formed. In actual applications, a semiconductor material layer may be processed to obtain a corresponding semiconductor layer (for example, the P-type semiconductor layer) every time that the semiconductor material layer (for example, the P-type semiconductor material layer) is formed, which is not limited in the embodiment of the present disclosure.

In step (3), a metal Mo material layer with a thickness between 200 nm and 400 nm is formed on the side of the photosensitive layer 122 away from the base substrate 11 by any of the processes such as magnetron sputtering, thermal evaporation or PECVD, and the metal Mo material layer is processed by a one-time patterning process to obtain the second electrode 123 that is stacked with the photosensitive layer 122.

In step 203, an insulating layer is formed on the side of the light detecting unit away from the photosensitive side of the light detecting unit.

Figure 13:
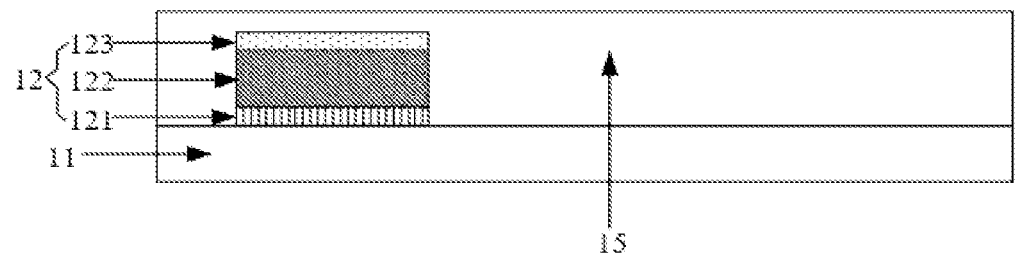

Reference is made to FIG. 13 that shows a schematic diagram of the insulating layer 15 being formed on the side of the light detecting unit 12 away from the photosensitive side of the light detecting unit 12 according to an embodiment of the present disclosure. The insulating layer 15 covers the light detecting unit 12, the side of the insulating layer 15 away from the light detecting unit 12 is a flat surface. As shown in FIG. 13, the side of the light detecting unit 12 away from the photosensitive side of the light detecting unit 12 is the side of the light detecting unit 12 away from the base substrate 11. The insulating layer 15 may include an organic insulating layer and an inorganic insulating layer that are stacked. The organic insulating layer may be made of resin, and the difference between the thickness of the organic insulating layer and the thickness of the light detecting unit 12 may range from 1.2 μm to 3 μm. The inorganic insulating layer may be a single-layered or multi-layered structure. For example, the inorganic insulating layer may be a $SiO_2$ single-layered structure or a $SiN/SiO_2$ multi-layered structure.

Exemplarily, forming the insulating layer 15 on the side of the light detecting unit 12 away from the photosensitive side of the light detecting unit 12 may include the following step (1) to step (2).

In step (1), a layer of resin is deposited on the side of the light detecting unit 12 away from the photosensitive side of the light detecting unit 12 as an organic insulating layer by any of the processes such as magnetron sputtering, thermal evaporation or PECVD, the organic insulating layer covers the light detecting unit 12.

In step (2), an SiN layer is first formed on the side of the organic insulating layer away from the light detecting unit 12 by any of the processes such as magnetron sputtering, thermal evaporation or PECVD, and then an $SiO_2$ layer is formed on the side of the SiN layer away from the SiN layer by any of the processes such as magnetron sputtering, thermal evaporation or PECVD, the SiN layer and the $SiO_2$ layer are stacked to form an inorganic insulating layer.

After the step (1) and step (2), an organic insulating layer and an inorganic insulating layer that are stacked may be obtained, and the organic insulating layer and the inorganic insulating layer that are stacked form the insulating layer 15.

In step 204, a switch unit is formed on the side of the insulating layer away from the light detecting unit, and the orthographic projection of the switch unit onto the base substrate is at least partially overlapped with the orthographic projection of the light detecting unit onto the base substrate.

Figure 14:
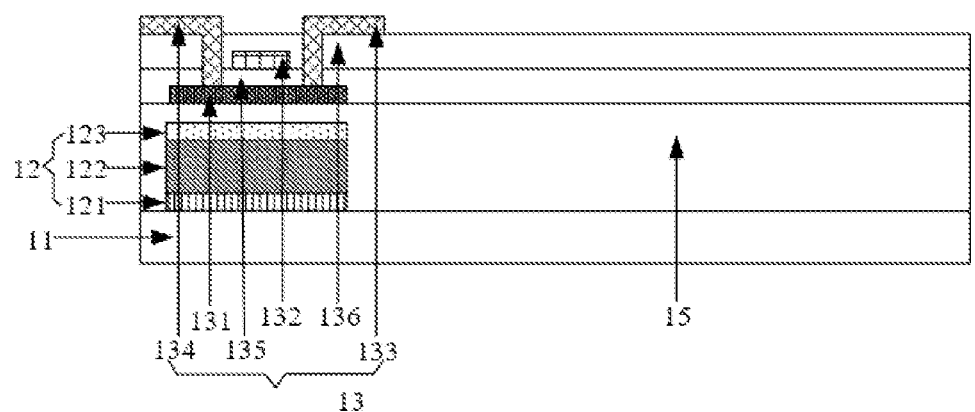

Reference is made to FIG. 14 that shows a schematic diagram of the switch unit 13 being formed on the side of the insulating layer 15 away from the light detecting unit 12 according to an embodiment of the present disclosure. The orthographic projection of the switch unit 13 onto the base substrate 11 is at least partially overlapped with the orthographic projection of the light detecting unit 12 onto the base substrate 11. In some embodiments, the orthographic projection of the switch unit 13 onto the base substrate 11 covers the orthographic projection of the light detecting unit 12 onto the base substrate 11. As shown in FIG. 14, the switch unit 13 includes an active layer 131, a control terminal 132, a first terminal 133, and a second terminal 134, where the control terminal 132, the first terminal 133, and the second terminal 134 are located on the side of the active layer 131 away from the light detecting unit 12. The first terminal 133 and the second electrode 134 are distributed in the same layer, the first terminal 133 and the second terminal 134 may be prepared through the same one patterning process, and the first terminal 133 and the second terminal 134 are electrically connected to the active layer 131 respectively. The switch unit 13 may be a TFT, as shown in FIG. 14, the switch unit 13 further includes a gate insulating layer 135 located between the active layer 131 and the control terminal 132, and an interlayer dielectric layer 136 located between the control terminal 132 and the first terminal 133 and the second terminal 134. Each of the gate insulating layer 135 and the interlayer dielectric layer 136 has a communicable first connection hole and a communicable second connection hole. The first terminal 133 (for example, the drain) is electrically connected to the active layer 131 sequentially through the first connection hole in the interlayer dielectric layer 136 and the first connection hole in the gate insulating layer 135, and the second terminal 134 (for example, the source) are electrically connected to the active layer 131 sequentially through the second connection hole in the interlayer dielectric layer 136 and the second connection hole in the gate insulating layer 135. The orthographic projection of the second electrode 123 onto the base substrate 11 covers the orthographic projection of the active layer 131 onto the base substrate 11. The active layer 131 may be an oxide active layer, an a-Si active layer, or a p-Si active layer. The oxide active layer is for example an IGZO active layer or an ITZO active layer. The portion of the active layer 131 where the first terminal 133 and the second terminal 134 are connected has been metallized. The gate insulating layer 135 may be made of transparent insulating materials such as $SiO_2$, $SiO_x$, $SiN_x$, $Al_2O_3$ or $SiO_xN_x$, the gate insulating layer 135 may be a single-layered or multi-layered structure, and the thickness of the gate insulating layer 135 may range from 80 nm to 150 nm. The control terminal 132 may be made of Mo, Cu, Al, Au and alloy materials thereof, and the thickness of the control terminal 132 may range from 200 nm to 400 nm. The interlayer dielectric layer 136 may be made of transparent insulating materials such as $SiO_2$, $SiO_x$, $SiN^x$, $Al_2O_3$ or $SiO_xN_x$, the interlayer dielectric layer 136 may be a single-layered or multi-layered structure, and the thickness of the interlayer dielectric layer 136 may range from 80 nm to 150 nm. The first terminal 133 and the second terminal 134 may both be made of Mg, Ag, Mo, Cu, Al, Au and alloy materials thereof, and the thickness of the first terminal 133 and the thickness of the second terminal 134 may range from 200 nm to 400 nm.

Exemplarily, forming the switch unit 13 on the side of the insulating layer 15 away from the light detecting unit 12 may include the following step (1) to step (6).

In step (1), an IGZO material layer is formed on the side of the insulating layer 15 away from the light detecting unit 12 by any of the processes such as magnetron sputtering, thermal evaporation or PECVD, and the IGZO material layer is processed by a one-time patterning process to obtain the active layer 131. The portion of the active layer 131 where the first terminal and the second terminal are connected is metallized by any of processes such as doping, plasma treatment, or atmosphere annealing, so as to increase the carrier concentration of the portion and to ensure an ohmic contact between the portion and the corresponding electrode (for example, the first terminal or the second terminal).

In step (2), an $SiO_2$ layer with a thickness between 80 nm and 150 nm is formed on the side of the active layer 131 away from the light detecting unit 12 as the gate insulating layer 135 by any of the processes such as magnetron sputtering, thermal evaporation or PECVD.

In step (3), a Mo material layer with a thickness between 200 nm and 400 nm is formed on the side of the gate insulating layer 135 away from the light detecting unit 12 by any of the processes such as magnetron sputtering, thermal evaporation or PECVD, and the metal Mo material layer is processed by a one-time patterning process to obtain the control terminal 132.

In step (4), an interlayer dielectric layer 136 is formed on the side of the control terminal 132 away from the light detecting unit 12. The process of forming the interlayer dielectric layer 136 may refer to the process of forming the gate insulating layer 135.

In step (5), the interlayer dielectric layer 136 and the gate insulating layer 135 are processed by a one-time patterning process to form a communicable first connection hole and a communicable second connection hole in each of the interlayer dielectric layer 136 and the gate insulation layer 135. The portion of the active layer 131 where the first terminal (for example, the drain) is connected is exposed through the first connection hole, and the portion of the active layer 131 where the second terminal (for example, the source) is connected is exposed through the second connection hole.

In step (6), a Mo material layer with a thickness between 200 nm and 400 nm is formed on the side of the interlayer dielectric layer 136 away from the light detecting unit 12 by any of the processes such as magnetron sputtering, thermal evaporation or PECVD, and the Mo material layer is processed by a one-time patterning process to obtain the first terminal 133 and the second terminal 134. The first terminal 133 is electrically connected to the active layer 131 sequentially through the first connection hole in the interlayer dielectric layer 136 and the first connection hole in the gate insulating layer 135. The second terminal 134 is electrically connected to the active layer 131 sequentially through the second connection hole in the interlayer dielectric layer 136 and the second connection hole in the gate insulating layer 135.

In step 205, a planarization layer is formed on the side of the switch unit away from the insulating layer.

Figure 15:
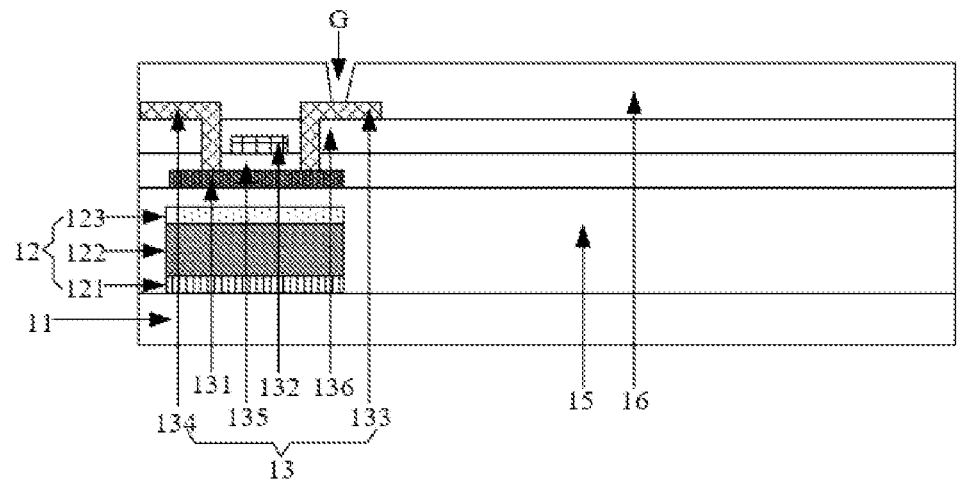

Reference is made to FIG. 15 that shows a schematic diagram of the planarization layer 16 being formed on the side of the switch unit 13 away from the insulating layer 15 according to an embodiment of the present disclosure. The side of the planarization layer 16 away from the switch unit 13 is a flat surface. The planarization layer 16 has an anode via G through which the first terminal 133 of the switch unit 13 is exposed. The planarization layer 16 may be made of resin.

Exemplarily, a resin layer with a thickness between 2 μm and 3 μm is formed on the side of the switch unit 13 away from the insulating layer 15 as the planarization layer 16 by any of the processes such as magnetron sputtering, thermal evaporation or PECVD.

In step 206, a light emitting unit and a pixel defining layer are formed on the side of the planarization layer away from the switch unit, the light emitting unit is located in the pixel opening defined by the pixel defining layer, the light emitting unit is electrically connected to the switch unit, and the light emitting unit and the light detecting unit share the switch unit.

Figure 16:
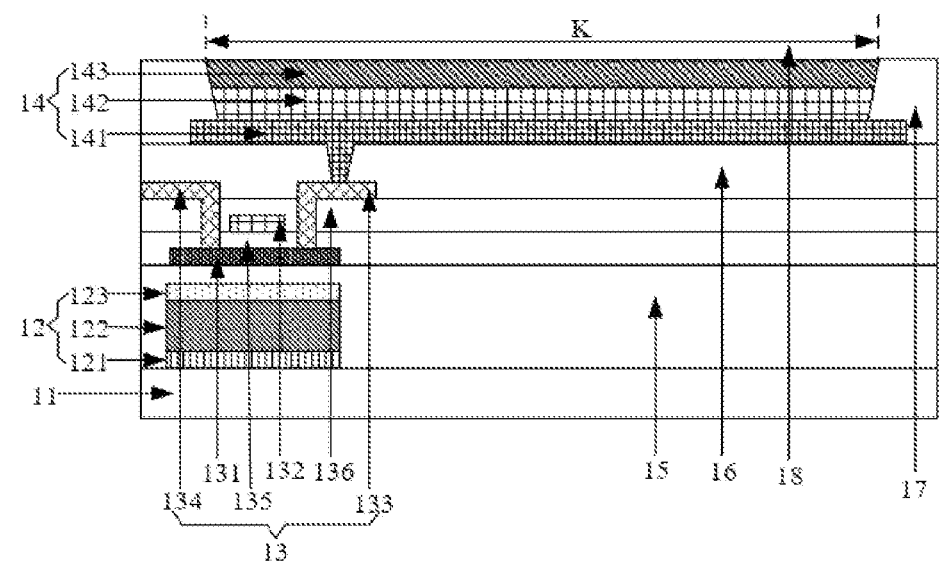

Reference is made to FIG. 16 that shows a schematic diagram of the light emitting unit 14 and the pixel defining layer 17 being formed on the side of the planarization layer 16 away from the switch unit 13 according to the embodiment of the present disclosure. The light emitting unit 14 is located in the pixel opening K defined by the pixel defining layer 17, the light emitting unit 14 includes an anode 141, an electroluminescent layer 142, and a cathode 143 that are sequentially stacked in a direction away from the base substrate 11. The anode 141 is electrically connected to the first terminal 133 through the anode via G in the planarization layer 16. The anode 141 may be made of Mg, Ag, Mo, Cu, Al, Au and alloy materials thereof. The electroluminescent layer 142 may be made of electroluminescent materials. The cathode 143 may be made of conductive materials such as ITO, IZO, and metal Ag. For example, the cathode 143 is an ITO/Ag/ITO multi-layered structure, where the thickness of the ITO film layer is 8 nm, the thickness of the Ag film layer is 100 nm, and the pixel defining layer 17 may be made of resin with strong liquid repellency.

Exemplarily, forming the light emitting unit 14 and the pixel defining layer 17 on the side of the planarization layer 16 away from the switch unit 13 may include the following step (1) to step (4).

In step (1), a layer of magnesium-silver alloy is deposited on the side of the planarization layer 16 away from the switch unit 13 to obtain an alloy material layer by any of the processes such as magnetron sputtering, thermal evaporation or PECVD, and the alloy material layer is processed by a one-time patterning process to obtain the anode 141 which is electrically connected to the first terminal 133 through the anode via G.

In step (2), a layer of resin is deposited on the side of the anode 141 away from the first terminal 133 to obtain a resin material layer by any of the processes such as magnetron sputtering, thermal evaporation or PECVD, and the resin material layer is processed by a one-time patterning process to obtain the pixel defining layer 17, the side surface of the anode 141 is located within the pixel defining layer 17, and the upper surface of the anode 141 is partially exposed through the pixel opening K.

In step (3), a layer of electroluminescent material is formed and printed in the pixel opening K by an inkjet printing process, and the printed electroluminescent material is dried to obtain an electroluminescent layer 142.

In step (4), an ITO material layer, an Ag material layer, and an ITO material layer that are sequentially stacked are formed on the side of the electroluminescent layer 142 away from the anode 141 by any of the processes such as magnetron sputtering, thermal evaporation or PECVD. The thickness of the ITO material layer may be 8 nm, and the thickness of the Ag material layer may be 100 nm. The ITO material layer, the Ag material layer, and the ITO material layer are processed by a one-time patterning process to obtain the cathode 143.

In step 207, an encapsulation layer is formed on the side of the light emitting unit away from the planarization layer.

A reference may be made to FIG. 4 that shows a schematic diagram of the encapsulation layer 18 being formed on the side of the light emitting unit 14 away from the planarization layer 16. The encapsulation layer 18 covers the light emitting unit 14 and the pixel defining layer 17. The encapsulation layer 18 may be a TFE layer or an encapsulation cover plate. The TFE layer includes an inorganic layer and an organic layer that are alternately stacked. The inorganic layer may be made of transparent insulating materials such as $SiO_2$, $SiO_x$, $SiN_x$, $Al_2O_3$ or $SiO_xN_x$, and the organic layer may be made of organic resin, the encapsulation cover plate may be a cover plate made of materials such as glass.

Exemplarily, taking the encapsulation layer 18 being a TFE layer as an example, forming the encapsulation layer 18 on the side of the light emitting unit 14 away from the planarization layer 16 may include: depositing a layer of $SiO_x$ on the side of the light emitting unit 14 away from the planarization layer 16 to obtain an $SiO_x$ material layer by any of the processes such as magnetron sputtering, thermal evaporation or PECVD, and processing the $SiO_x$ material layer by a one-time patterning process to obtain the inorganic layer; printing a layer of organic resin on the side of the inorganic layer away from the planarization layer 16 by an inkjet printing process, and drying the printed organic resin to obtain the organic layer, thereby obtaining the encapsulation layer.

The one-time patterning process involved in the embodiments of the present disclosure includes photoresist coating, exposure, development, etching, and photoresist stripping. The processing of a material layer (for example, an ITO material layer) by the one-time patterning process includes: firstly, coating the material layer (for example, the ITO material layer) with a layer of photoresist to form a photoresist layer; next, exposing the photoresist layer with a mask, so that the photoresist layer forms a completely-exposed region and a non-exposed region; subsequently, adopting a developing process for processing, so that the photoresist in the completely-exposed region is completely removed, and all the photoresist in the non-exposed region is retained; hereafter, etching a region, corresponding to the completely-exposed region, on the material layer (for example, the ITO material layer) by an etching process; and stripping the photoresist in the non-exposed region, so that a corresponding structure (for example, the first electrode 121) is obtained. Here, the description is given by taking the photoresist as a positive photoresist. When the photoresist is a negative photoresist, the process of the one-time patterning process may make reference to the description in this paragraph and will not be repeated in the embodiment of the present disclosure here.

In the method for manufacturing an array substrate according to the embodiments of the present disclosure, the order of the steps may be appropriately adjusted, and the steps may be correspondingly increased or decreased as needed. Changed methods which can be easily expected by any person skilled in the art within the technical scope disclosed by the present disclosure should be covered by the protection scope of the present disclosure, and thus will not be repeated herein.

In summary, with respect to the method for manufacturing an array substrate according to the embodiment of the present disclosure, the light emitting unit and the light detecting unit share the switch unit in the pixel region, which helps to reduce the number of the switch units on the array substrate, thereby simplifying the structure of the array substrate. With respect to the method for manufacturing an array substrate according to the embodiment of the present disclosure, since the light detecting unit is manufactured first and then the switch unit is manufactured, the influence of the process of preparing the light detecting unit on the active layer of the switch unit may be avoided.

The following is an embodiment of the method for detecting light of the present disclosure. The method for detecting light and principle of the present disclosure may be referred to the descriptions in the following embodiments.

Figure 17:
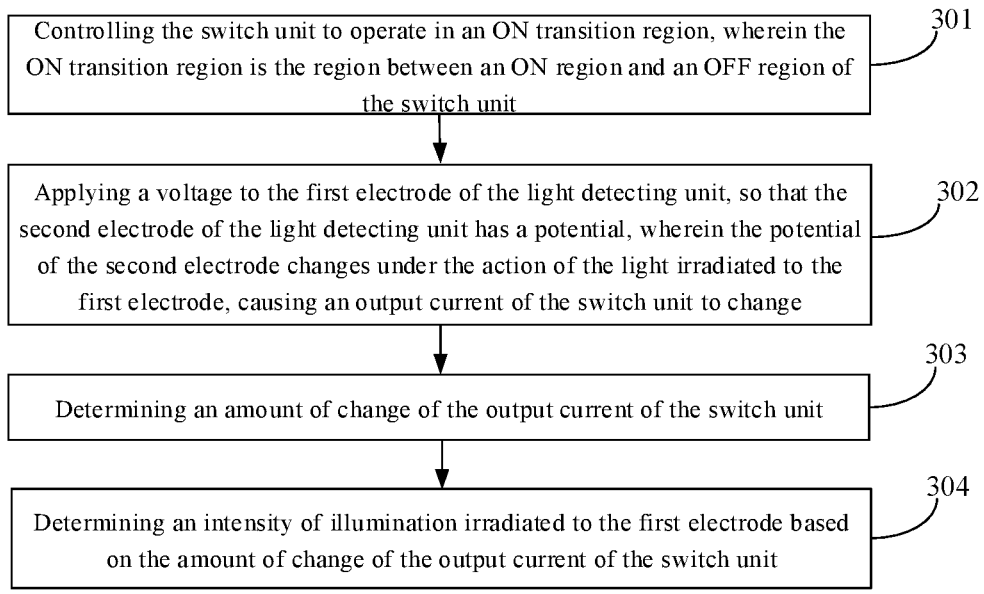
FIG. 17 is a flow chart of a method for detecting light according to an embodiment of the present disclosure.

Reference is made to FIG. 17 that shows a flow chart of a method for detecting light according to an embodiment of the present disclosure. The method for detecting light may be used for the array substrate according to the above embodiments, and each of the pixel regions of the array substrate is provided with a light detecting unit, a switch unit and a light emitting unit. The light detecting unit in each of the pixel regions and the light emitting unit in the pixel region share the switch unit in the pixel region. The light detecting unit includes a first electrode, a photosensitive layer, and a second electrode, and the method for detecting light may be executed by an assembly for detecting light. Referring to FIG. 17, the method for detecting light may include steps 301 to 304.

In step 301, the switch unit is controlled to operate in an ON transition region, where the ON transition region is the region between an ON region and an OFF region of the switch unit.

In step 302, a voltage is applied to the first electrode of the light detecting unit, so that the second electrode of the light detecting unit has a potential, where the potential of the second electrode changes under the action of the light irradiated to the first electrode, causing an output current of the switch unit to change.

In step 303, an amount of change of the output current of the switch unit is determined.

In step 304, an intensity of illumination irradiated to the first electrode is determined based on the amount of change of the output current of the switch unit.

In some embodiments, the light irradiated to the first electrode is the light reflected by a fingerprint. After step 303, the method for detecting light further includes: performing fingerprint detection based on the amount of change of the output current of a plurality of the switch units.

In summary, with respect to the method for detecting light according to the embodiment of the present disclosure, the light emitting unit and the light detecting unit share the switch unit in each of the pixel regions of the array substrate, which helps to reduce the number of the switch units on the array substrate, thereby simplifying the structure of the array substrate.

Figure 18:
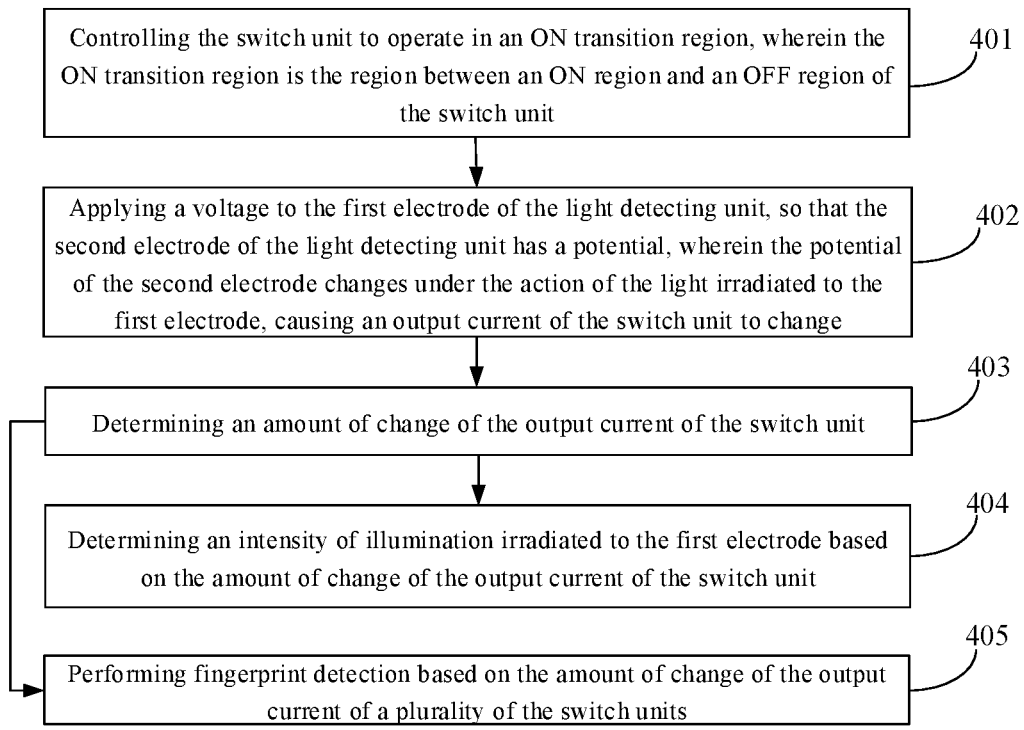
FIG. 18 is a flow chart of another method for detecting light according to an embodiment of the present disclosure.

Reference is made to FIG. 18 that shows a flow chart of another method for detecting light according to an embodiment of the present disclosure. The method for detecting light may be used for the array substrate according to the above embodiments. Each of the pixel regions of the array substrate is provided with a light detecting unit, a switch unit and a light emitting unit. The light detecting unit in each of the pixel regions and the light emitting unit in the pixel region share the switch unit in the pixel region. The light detecting unit includes a first electrode, a photosensitive layer, and a second electrode, and the method for detecting light may be executed by an assembly for detecting light. Referring to FIG. 18, the method for detecting light may include steps 401 to 405.

In step 401, the switch unit is controlled to operate in an ON transition region, where the ON transition region is the region between an ON region and an OFF region of the switch unit.

In some embodiments, the assembly for detecting light may be electrically connected to the control terminal (for example, the gate) of the switch unit, and the assembly for detecting light may apply a control voltage (for example, a gate voltage) to the switch unit to make the switch unit operate in the ON transition region. When the switch unit operates in the ON transition region, the current transmitted to the light emitting unit through the switch unit is not enough to turn on the light emitting unit, and thus the light emitting unit is in the off state and the light emitting unit does not emit light. The ON transition region is the region between an ON region and an OFF region of the switch unit, and when the switch unit is a TFT, the ON transition region is a subthreshold swing region.

In step 402, a voltage is applied to the first electrode of the light detecting unit, so that the second electrode of the light detecting unit has a potential, where the potential of the second electrode changes under the action of the light irradiated to the first electrode, causing an output current of the switch unit to change.

In some embodiments, the assembly for detecting light may be electrically connected to the first electrode of the light detecting unit, and the assembly for detecting light may apply a voltage to the first electrode of the light detecting unit. After the voltage is applied to the first electrode, the photosensitive layer (for example, the PIN layer) of the assembly for detecting light can accumulate charge, so that the second electrode of the assembly for detecting light has a potential.

In the embodiment of the present disclosure, when light is irradiated onto the first electrode, the light detecting unit generates a photo-generated bias which may cause the potential of the second electrode to change, and the change of the potential of the second electrode may cause the output current of the switch unit to change, the specific principle thereof may be referred to the related descriptions in FIG. 5 to FIG. 9.

In some embodiments, before step 402, a positive voltage may be applied to the first electrode of the light detecting unit to make the photosensitive layer be forwardly biased, so as to remove residual charge in the photosensitive layer, and then step 402 is performed, which may avoid the influence of the residual charge in the photosensitive layer on the process of light detection.

In step 403, an amount of change of the output current of the switch unit is determined.

In some embodiments, when the switch unit is a TFT, the output current of the switch unit is the leakage current of the switch unit. The assembly for detecting light may be electrically connected to the first terminal (that is, the drain) of the switch unit. The output current of the switch unit may be transmitted to the assembly for detecting light through the first terminal of the switch unit. The assembly for detecting light may determine the amount of change of the output current of the switch unit based on the magnitude of the output current of the switch unit before illumination and the magnitude of the output current of the switch unit after illumination.

In step 404, an intensity of illumination irradiated to the first electrode is determined based on the amount of change of the output current of the switch unit.

The intensity of illumination irradiated to the first electrode is the intensity of light irradiated to the first electrode.

In some embodiments, the light detecting unit may maintain the correlation between the amount of change of the output current and the intensity of illumination. The light detecting unit may determine the intensity of illumination irradiated to the first electrode based on the amount of change of the output current of the switch unit and the correlation between the amount of change of the output current and the intensity of illumination.

In step 405, fingerprint detection is performed based on the amount of change of the output current of a plurality of the switch units.

When a finger is pressed on the light-emitting surface (for example, the base substrate) of the array substrate, the fingerprint of the finger may reflect the light emitted from the array substrate to generate reflected light, and the reflected light may enter the light detecting unit in at least one pixel region, and the reflected light reflected by the "ridge" and "groove" of the fingerprint is different. The reflected light reflected by the "ridge" and "groove" of the fingerprint may enter the light detecting unit in a different pixel region, causing the output current of the switch unit in the different pixel region to change, and the amount of change of the output current of the switch unit in the different pixel region is different. Therefore, the contour of the "ridge" and "groove" of the fingerprint may be imaged based on the amount of change of the output current of the switch unit in the different pixel regions, thereby realizing fingerprint detection.

In the embodiment of the present disclosure, the light detecting unit can also detect the ambient light where the array substrate is located, and the light detecting unit can transmit the intensity of the detected ambient light to the assembly for detecting light. When the array substrate is applied to a smart terminal such as a mobile phone, the assembly for detecting light can adjust the screen brightness of the smart terminal based on the intensity of the ambient light detected by the light detecting unit, so as to realize the automatic adjustment of the screen brightness by the smart terminal, which will not be repeated in the embodiment of the present disclosure.

In summary, with respect to the method for detecting light according to the embodiment of the present disclosure, the light emitting unit and the light detecting unit share the switch unit in each of the pixel regions of the array substrate, which helps to reduce the number of the switch units on the array substrate, thereby simplifying the structure of the array substrate.

The following is an embodiment of the assembly for detecting light of the present disclosure, which may be used to execute the method for detecting light of the present disclosure. For details that are not disclosed in the embodiment of the assembly for detecting light of the present disclosure, reference is made to the embodiment of the method for detecting light of the present disclosure.

Figure 19:
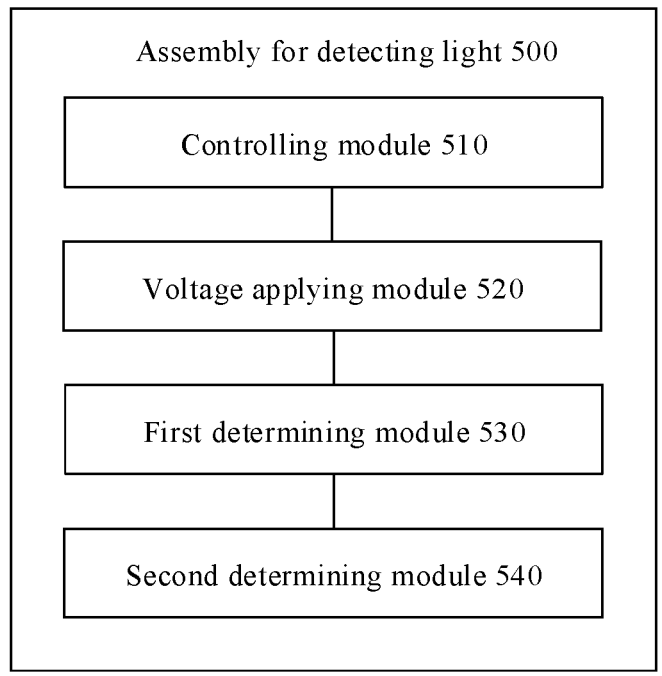
FIG. 19 is a block diagram of an assembly for detecting light according to an embodiment of the present disclosure.

Reference is made to FIG. 19 that shows a block diagram of an assembly for detecting light 500 according to an embodiment of the present disclosure. The assembly for detecting light 500 may be configured to execute the method for detecting light according to the embodiment shown in FIG. 17 or FIG. 18. Referring to FIG. 19, the assembly for detecting light 500 may include, but is not limited to:

a controlling module 510, configured to control the switch unit to operate in an ON transition region, where the ON transition region is the region between an ON region and an OFF region of the switch unit;

a voltage applying module 520, configured to apply a voltage to the first electrode of the light detecting unit, so that the second electrode of the light detecting unit has a potential, where the potential of the second electrode changes under the action of the light irradiated to the first electrode, causing an output current of the switch unit to change;

a first determining module 530, configured to determine an amount of change of the output current of the switch unit; and a second determining module 540, configured to determine an intensity of illumination irradiated to the first electrode based on the amount of change of the output current of the switch unit.

Figure 20:
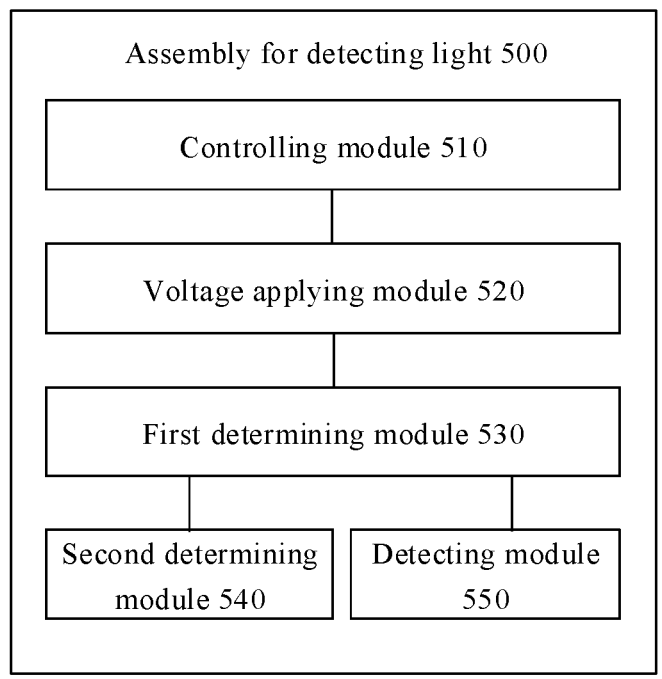
FIG. 20 is a block diagram of another assembly for detecting light according to an embodiment of the present disclosure.

In some embodiments, the light irradiated to the first electrode is the light reflected by a fingerprint. Reference is made to FIG. 20, on the basis of FIG. 19, the assembly for detecting light 500 further includes: a detecting module 550 configured to perform fingerprint detection based on the amount of change of the output current of a plurality of the switch units.

In summary, with respect to the assembly for detecting light according to the embodiment of the present disclosure, the light emitting unit and the light detecting unit share the switch unit in each of the pixel regions of the array substrate, which helps to reduce the number of the switch units on the array substrate, thereby simplifying the structure of the array substrate.

Based on the same inventive concept, an embodiment of the present disclosure further provides a display device which includes the array substrate shown in FIG. 1 to FIG. 4. In some embodiments, the display device further includes the assembly for detecting light shown in FIG. 19 or FIG. 20. The display device may be an electroluminescent display device, for example, an OLED display device or a QLED display device.

The display device may be any product or component having a display function, such as electronic paper, a display substrate, a display panel, a watch, a bracelet, a mobile phone, a tablet computer, a television, a display, a laptop computer, a digital photo frame and a navigator.

In the present disclosure, the term "electrically connected" refers to a connection that is capable of transferring charge, but not necessarily includes charge transfer. For example, if A is electrically connected to B, it means that A is connected to B and charges can be transferred between A and B, whereas the charge transfer does not necessarily occur between A and B. The term "at least one" means one or more than one, and the term "a plurality of" means two or more, unless otherwise expressly provided. The terms such as "first", "second" and "third" are merely for a descriptive purpose, and cannot be understood as indicating or implying a relative importance.

It may be understood by an ordinary person skilled in the art that all or part of steps in the above embodiments may be completed by hardware or by a program instructing relevant hardware. The program may be stored in a computer-readable storage medium which may be a read-only memory, a magnetic disk, an optical disc or the like.

The above are merely exemplary embodiments of the present disclosure, but are not intended to limit the present disclosure. Any modifications, equivalent replacements and improvements made within the spirits and principles of the present disclosure should be included within the scope of protection of the present disclosure.

What is claimed is:

1. An array substrate, comprising:
a base substrate having a pixel region; and
a light detecting unit, a switch unit, and a light emitting unit that are located in the pixel region, wherein the light emitting unit is electrically connected to the switch unit, the light detecting unit is insulated from the switch unit, and a current generated by the light detecting unit under irradiation of light affects an output current of the switch unit, so that the light detecting unit and the light emitting unit share the switch unit.

2. The array substrate according to claim 1, wherein,
the switch unit is located on a side away from a photosensitive side of the light detecting unit, and an orthographic projection of the light detecting unit onto the base substrate is at least partially overlapped with an orthographic projection of the switch unit onto the base substrate.

3. The array substrate according to claim 2, wherein,
the orthographic projection of the switch unit onto the base substrate covers the orthographic projection of the light detecting unit onto the base substrate.

4. The array substrate according to claim 2, wherein,
the light detecting unit comprises a first electrode, a photosensitive layer, and a second electrode that are sequentially stacked in a direction close to the switch unit; and
the switch unit comprises an active layer, a control terminal, a first terminal, and a second terminal, wherein the control terminal, the first terminal, and the second terminal are located on a side of the active layer away from the light detecting unit, and one of the first terminal and the second terminal is a source, and the other thereof is a drain.

5. The array substrate according to claim 4, wherein,
the second electrode is made of a light-shielding material, and an orthographic projection of the second electrode onto the base substrate is at least partially overlapped with an orthographic projection of the active layer onto the base substrate.

6. The array substrate according to claim 5, wherein,
the orthographic projection of the second electrode onto the base substrate covers the orthographic projection of the active layer onto the base substrate.

7. The array substrate according to claim 4, wherein,
the light emitting unit is an electroluminescent unit, and the first terminal of the switch unit is electrically connected to an anode of the light emitting unit.

8. The array substrate according to claim 2, wherein the array substrate further comprises:
an insulating layer located between the light detecting unit and the switch unit;
a planarization layer located between the switch unit and the light emitting unit; and, a pixel defining layer located on a side of the planarization layer away from the switch unit, wherein the light emitting unit is located in a pixel opening defined by the pixel defining layer.

9. The array substrate according to claim 1, wherein,
the light detecting unit, the switch unit, and the light emitting unit are sequentially distributed in a direction away from the base substrate, and the array substrate further comprises:
an encapsulation layer located on a side of the light emitting unit away from the base substrate.

10. An assembly for detecting light for use in the array substrate according to claim 1, wherein the light detecting unit of the array substrate comprises a first electrode, a photosensitive layer, and a second electrode, wherein the assembly for detecting light comprises:
a controlling circuit, configured to control the switch unit to operate in an ON transition region, wherein the ON transition region is a region between an ON region and an OFF region of the switch unit;
a voltage applying circuit, configured to apply a voltage to the first electrode of the light detecting unit, so that the second electrode of the light detecting unit has a potential, wherein the potential of the second electrode changes under the action of the light irradiated to the first electrode, causing an output current of the switch unit to change;
a first determining circuit, configured to determine an amount of change of the output current of the switch unit; and
a second determining circuit, configured to determine an intensity of illumination irradiated to the first electrode based on the amount of change of the output current of the switch unit.

11. The assembly for detecting light according to claim 10, wherein the light irradiated to the first electrode is light reflected by a fingerprint, and the assembly for detecting light further comprises:
a detecting circuit, configured to perform fingerprint detection based on the amount of change of the output current of a plurality of the switch units.

12. A display device, comprising: the array substrate according to claim 1.

13. A method for detecting light for use in an array substrate, wherein the array substrate comprises:
a base substrate having a pixel region; and
a light detecting unit, a switch unit, and a light emitting unit that are located in the pixel region, and the light detecting unit and the light emitting unit share the switch unit, the light detecting unit of the array substrate comprises a first electrode, a photosensitive layer, and a second electrode;
wherein the method for detecting light comprises:
controlling the switch unit to operate in an ON transition region, wherein the ON transition region is a region between an ON region and an OFF region of the switch unit;
applying a voltage to the first electrode of the light detecting unit, so that the second electrode of the light detecting unit has a potential, wherein the potential of the second electrode changes under the action of the light irradiated to the first electrode, causing an output current of the switch unit to change;
determining an amount of change of the output current of the switch unit; and determining an intensity of illumination irradiated to the first electrode based on the amount of change of the output current of the switch unit.

14. The method for detecting light according to claim 13, wherein,
the light irradiated to the first electrode is light reflected by a fingerprint, and after determining the amount of change of the output current of the switch unit, the method for detecting light further comprises:
performing fingerprint detection based on the amount of change of the output current of a plurality of the switch units.

15. A method for manufacturing an array substrate, comprising:
providing a base substrate having a pixel region;
forming a light detecting unit, a switch unit, and a light emitting unit in the pixel region, wherein the light emitting unit is electrically connected to the switch unit, the light detecting unit is insulated from the switch unit, and a current generated by the light detecting unit under irradiation of light affects an output current of the switch unit, so that the light detecting unit and the light emitting unit share the switch unit.

16. The method for manufacturing the array substrate according to claim 15, wherein;
forming the light detecting unit, the switch unit, and the light emitting unit in the pixel region so that the light detecting unit and the light emitting unit share the switch unit, comprises:
forming the light detecting unit in the pixel region;
forming the switch unit on a side of the light detecting unit away from a photosensitive side of the light detecting unit, wherein an orthographic projection of the light detecting unit onto the base substrate is at least partially overlapped with an orthographic projection of the switch unit onto the base substrate; and
forming the light emitting unit on a side of the switch unit away from the light detecting unit.

17. The method for manufacturing the array substrate according to claim 16, wherein,
forming the light detecting unit in the pixel region comprises:
forming a first electrode, a photosensitive layer, and a second electrode in the pixel region, wherein the first electrode, the photosensitive layer, and the second electrode are sequentially stacked in a direction away from the base substrate;
forming the switch unit on the side of the light detecting unit away from the photosensitive side of the light detecting unit comprises:
forming an active layer on the side of the light detecting unit away from the photosensitive side of the light detecting unit; and
forming a control terminal, a first terminal, and a second terminal on a side of the active layer away from the light detecting unit, wherein one of the first terminal and the second terminal is a source, and the other thereof is a drain.

18. The method for manufacturing the array substrate according to claim 16, wherein,
before forming the switch unit on the side of the light detecting unit away from the photosensitive side of the light detecting unit, the method for manufacturing an array substrate further comprises:
forming an insulating layer on the side of the light detecting unit away from the photosensitive side of the light detecting unit;

forming the switch unit on the side of the light detecting unit away from the photosensitive side of the light detecting unit comprises:

forming the switch unit on a side of the insulating layer away from the light detecting unit.

19. The method for manufacturing the array substrate according to claim 16, wherein, before forming the light emitting unit on the side of the switch unit away from the light detecting unit, the method for manufacturing an array substrate further comprises:

forming a planarization layer on the side of the switch unit away from the light detecting unit;

forming the light emitting unit on the side of the switch unit away from the light detecting unit comprises:

forming the light emitting unit on a side of the planarization layer away from the light detecting unit;

the method for manufacturing an array substrate further comprises:

forming a pixel defining layer on the side of the planarization layer away from the switch unit, wherein the light emitting unit is located in a pixel opening defined by the pixel defining layer.

20. The method for manufacturing the array substrate according to claim 15, wherein the method for manufacturing the array substrate further comprises:

forming an encapsulation layer on a side of the light emitting unit away from the base substrate.

\* \* \* \* \*